United States Patent
Yu et al.

(10) Patent No.: US 12,168,536 B2
(45) Date of Patent: Dec. 17, 2024

(54) LIQUID LOADING DEVICE AND LIQUID LOADING METHOD

(71) Applicant: Fulian Yuzhan Precision Technology Co., Ltd, Shenzhen (CN)

(72) Inventors: Hui-Tse Yu, New Taipei (TW); Chen-Yu Hong, New Taipei (TW); Yong Chen, Shenzhen (CN); Zhi-Chao Xu, Shenzhen (CN)

(73) Assignee: Fulian Yuzhan Precision Technology Co., Ltd, Shenzhen (CN)

( * ) Notice: Subject to any disclaimer, the term of this patent is extended or adjusted under 35 U.S.C. 154(b) by 226 days.

(21) Appl. No.: 17/557,266

(22) Filed: Dec. 21, 2021

(65) Prior Publication Data

US 2022/0204194 A1    Jun. 30, 2022

(30) Foreign Application Priority Data

Dec. 31, 2020  (CN) .............................. 202011615319

(51) Int. Cl.
| *B65B 3/18* | (2006.01) |
| *B65B 31/04* | (2006.01) |
| *B65B 57/14* | (2006.01) |
| *H05K 5/00* | (2006.01) |

(52) U.S. Cl.
CPC .............. *B65B 3/18* (2013.01); *B65B 31/042* (2013.01); *B65B 31/044* (2013.01); *B65B 57/145* (2013.01); *H05K 5/0091* (2013.01)

(58) Field of Classification Search
CPC .. B65B 3/04; B65B 3/18; B65B 31/04; B65B 31/042; B65B 31/044; B65B 57/14; B65B 57/145; H05K 5/0091
See application file for complete search history.

(56) References Cited

U.S. PATENT DOCUMENTS

| 6,506,325 B1 * | 1/2003 | Cartwright ............ B29C 70/443 264/516 |
| 6,555,045 B2 * | 4/2003 | McClure ............... B29C 70/548 425/389 |
| 7,334,782 B2 * | 2/2008 | Woods .................. B29C 70/443 264/510 |

(Continued)

FOREIGN PATENT DOCUMENTS

| CN | 102039262 A | 5/2011 |
| CN | 202225377 U | 5/2012 |

(Continued)

OTHER PUBLICATIONS

Machine translation of CN111013932, Apr. 2020, all pages (Year: 2020).*

*Primary Examiner* — Nicolas A Arnett
(74) *Attorney, Agent, or Firm* — ScienBiziP, P.C.

(57) ABSTRACT

The present disclosure provides a liquid loading device for loading liquid into a product. The product includes a cavity and a liquid inlet communicated with the cavity. The liquid loading device includes a loading module to load liquid into the cavity through the liquid inlet. A sensor senses a pressure in the cavity and generates at least one pressure value. A controller is coupled to the sensor and the loading module, and controls the loading module to operate based on related data. In addition, the present disclosure also provides a liquid loading method.

14 Claims, 20 Drawing Sheets

(56) References Cited

U.S. PATENT DOCUMENTS

| | | | | |
|---|---|---|---|---|
| 8,808,612 | B2 * | 8/2014 | Alms | B29C 70/546 |
| | | | | 264/258 |
| 9,604,415 | B2 * | 3/2017 | Yamamoto | B29C 70/548 |
| 2017/0305587 | A1 * | 10/2017 | Cortes | B65B 7/02 |
| 2022/0289410 | A1 * | 9/2022 | Yu | B65B 3/18 |

FOREIGN PATENT DOCUMENTS

| | | | | |
|---|---|---|---|---|
| CN | 206510453 U | | 9/2017 | |
| CN | 111013932 A | | 4/2020 | |
| CN | 210411366 U | | 4/2020 | |
| CN | 211051811 U | * | 7/2020 | B05D 3/04 |
| EP | 4279737 A1 | * | 11/2023 | F04B 35/008 |

* cited by examiner

LIQUID LOADING DEVICE AND LIQUID LOADING METHOD

CROSS-REFERENCE TO RELATED APPLICATIONS

This application claims all benefits accruing under 35 U.S.C. § 119 from Chinese Patent Application No. 202011615319.7, filed on Dec. 31, 2020, in the State Intellectual Property Office of China, the entire contents of which are incorporated herein by reference.

FIELD

The present disclosure relates to product manufacturing, and more particularly, relates to a liquid loading device and a liquid loading method.

BACKGROUND

During a liquid-adding process, liquid needs to be loaded into an internal space of a product. The loaded liquid usually has a certain viscosity, and the fluidity thereof is relatively poor. The existing liquid loading process is usually carried out in an air environment. When the liquid infills the space of the product, air in the space may be easily trapped inside the liquid, resulting in poor filling saturation and insufficient compactness of the internal space. Thus, the impact resistance of the product is weak.

DETAILED DESCRIPTION

Implementations of the present disclosure will now be described, by way of example only, with reference to the attached figures. The implementations are only a portion of the embodiments rather than all the embodiments of the present disclosure.

It should be noted that when a component is referred to as being "mounted on" another component, it can be directly mounted on the another component or an intermediate component may also exist there between. When a component is considered to be "disposed on" another component, it can be directly disposed on the another component or an intermediate component may exist there between.

Figure 1:
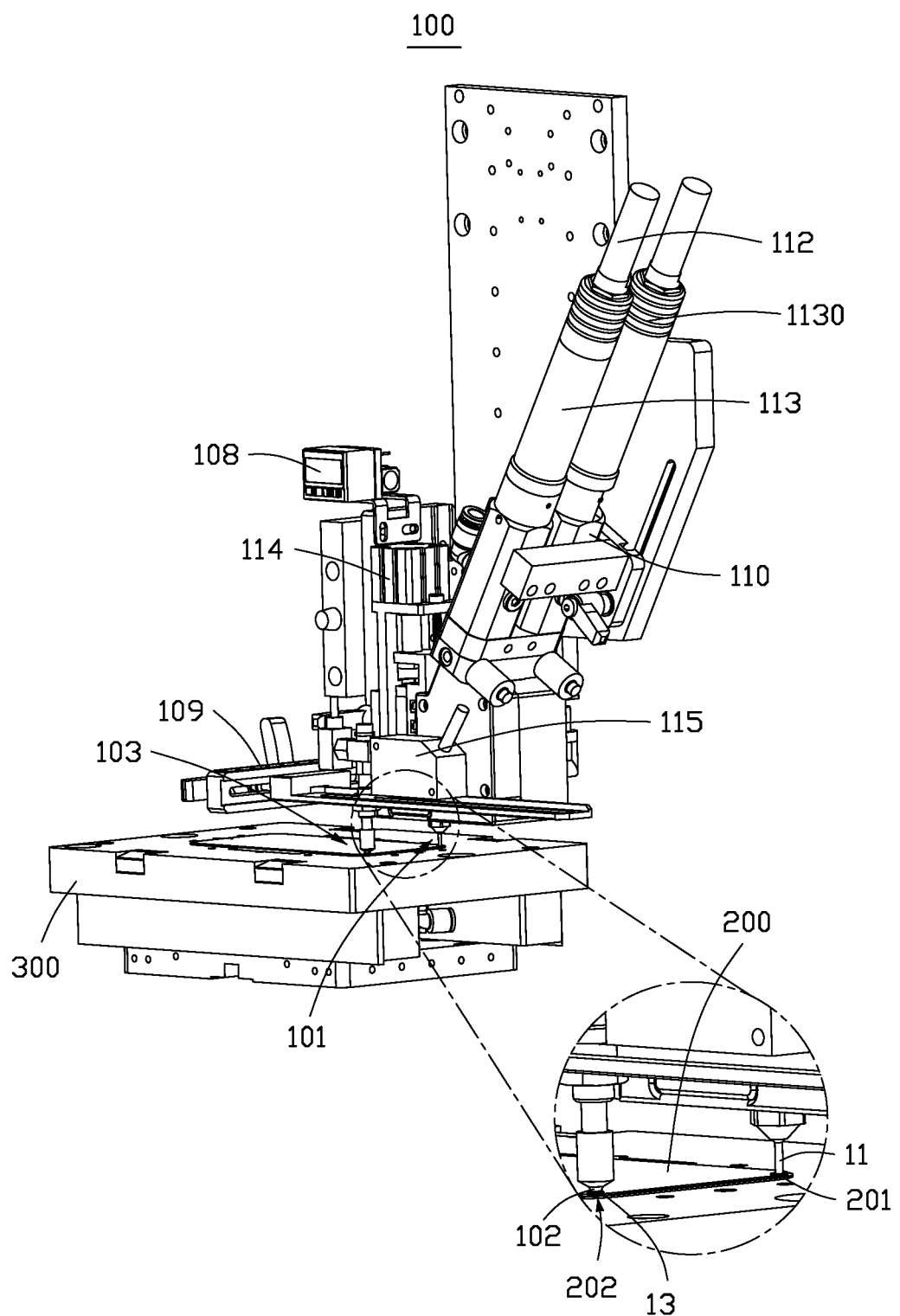
FIG. 1 is a three-dimensional view of a liquid loading device according to the present disclosure.
Figure 2:
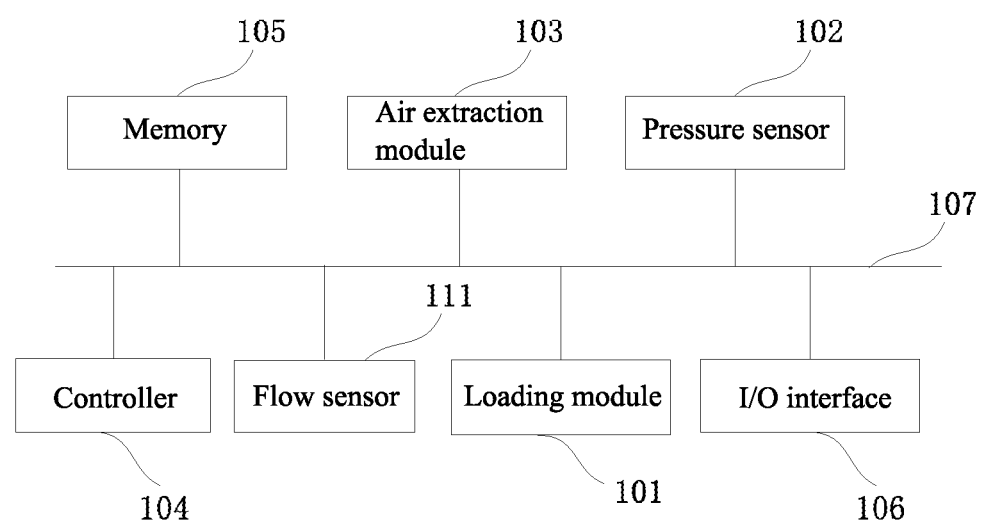
FIG. 2 is a block diagram of a liquid loading device according to an embodiment of the present disclosure.
Figure 3:
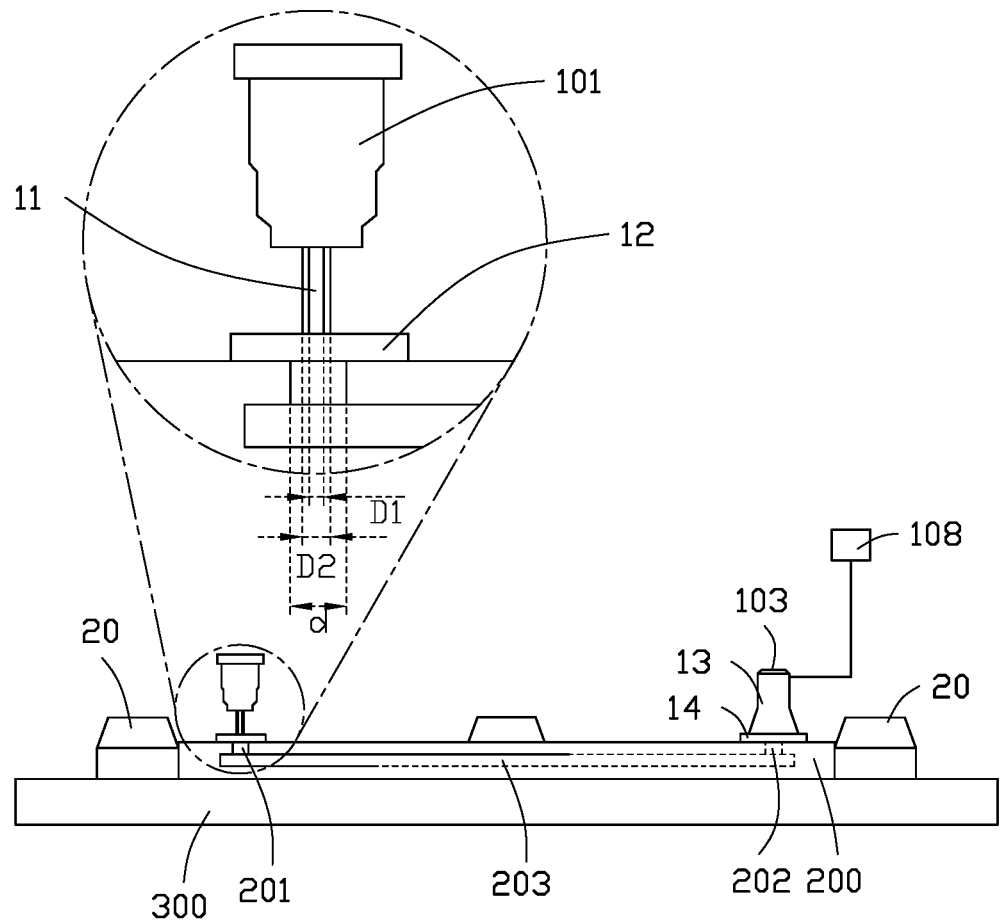
FIG. 3 is a side view of a liquid loading device according to an embodiment of the present disclosure.

Referring to FIGS. 1 to 3, FIG. 1 is a three-dimensional view of a liquid loading device 100 according to an embodiment of the present disclosure, FIG. 2 is a block diagram of the liquid loading device 100 according to an embodiment of the present disclosure, and FIG. 3 is a side view of the liquid loading device 100 according to an embodiment of the present disclosure. The liquid loading device 100 can load liquid into a product 200 to enhance the impact resistance of the product 200.

The product 200 includes at least one liquid inlet 201, at least one air outlet 202, and at least one cavity 203. The liquid inlet 201 and the air outlet 202 communicate with the cavity 203.

The liquid loading device 100 includes a loading module 101, a pressure sensor 102, an air extraction module 103, a display 108, a base frame 109, and a workbench 300.

The loading module 101 includes a loading nozzle. The loading module 101 can load liquid through the liquid inlet 201 and into the cavity 203 of the product 200 by the loading nozzle. In the embodiment, the loading nozzle is a loading needle 11. In other embodiments, the loading nozzle may also be a catheter. The loading module 101 may also include a liquid mixing pipe (not shown in the figures) and a liquid mixing valve 110 connected to the liquid mixing pipe. The liquid mixing pipe can mix different types of liquids therein. The liquid mixing valve 110 can control the liquid mixing pipe to open or close.

The loading module 101 also includes a liquid outlet valve (not shown in the figures). The liquid outlet valve is connected to the loading needle 11. The liquid outlet valve is controlled to be opened or closed, thereby controlling the loading needle 11 to start to load or stop loading liquid. In an embodiment, the liquid outlet valve is a flow control valve, which not only can control the loading needle 11 to start to load or stop loading liquid, but also can control the loading speed from the loaded needle 11.

In the embodiment, the loading module 101 further includes a first driving member 112 and a conveying pipe 113 connected to the loading nozzle. The conveying pipe 113 has a conveying screw 1130 therein. The first driving member 112 is connected to the conveying screw 1130, and can drive the conveying screw 1130 to rotate, thereby driving the liquid in the conveying pipe 113 to flow toward to the loading nozzle. The first driving member 112 may be a motor. The rotation speed of the conveying screw 1130 can be controlled by controlling the rotation speed of the first driving member 112. Then, the loading speed of the liquid loaded into the cavity 203 can also be controlled, thereby allowing the loading speed during the entire liquid loading process to be controllable.

The loading module 101 also includes a second driving member 114 and a blocking valve (not shown in the figures) disposed in the loading nozzle. The blocking valve is connected to the second driving member 114. The second driving member 114 can drive the blocking valve to block the flow of liquid towards to the loading nozzle, and can also drive the blocking valve to open, so that the liquid can flow to the loading nozzle. The second driving member 114 may be a motor. The blocking valve can block the loading nozzle when pressed downwards or lifted upwards.

The loading module 101 also includes a position sensor 115, which can detect the positional relationship between the loading nozzle and the liquid inlet 201, such as a distance between the loading nozzle and the liquid inlet 201. Thus, the loading nozzle can be accurately moved to the liquid inlet 201 without scratching the product 200.

The loading module 101 may also include a condenser (not shown in the figures), which can prevent the liquid from solidifying or from blocking related components when the liquid flows into the cavity 203 of the product 200. Thus, the fluidity of the liquid is improved. The liquid loading device 100 may also be entirely placed in an environment having condensing function.

The air extraction module 103 includes an air extraction nozzle 13, and the air extraction nozzle 13 can extract air from the cavity 203 through the air outlet 202. Thus, a certain negative pressure is formed in the cavity 203, which facilitates the loading module 101 to load the liquid. The air extraction module 103 may also be omitted, and another air extraction device, which is independent of the liquid loading device 100, may be used to perform the air extraction on the product 200.

The loading module 101, the air extraction module 103, the first driving member 112, and the second driving member 114 are all mounted on the base frame 109. The base frame 109 realizes physical connection between the structural components of the two modules in the liquid loading device 100. In other embodiments, the loading module 101, the air extraction module 103, the first driving member 112, and the second driving member 114 may also be mounted on other base frame according to different structures of the liquid loading device 100, or be directly connected together without the base frame.

The pressure sensor 102 includes a sensing connector (not shown in the figures). The pressure sensor 102 can sense a pressure in the cavity 203 of the product 200 through the sensing connector, and then generate a pressure value in the form of an electrical signal or a digital signal. In the embodiment, the sensing connector is disposed near the air extraction nozzle 13 of the air extraction module 103, which can minimize the sensing error and allow the sensed pressure value to be closer to the real pressure value in the cavity 203 of the product 200. The pressure sensor 102 may be a digital sensor. The digital sensor uses an electronic signal line instead of an air pipeline to sense the pressure value, which can improve the response speed and the authenticity of the pressure signal. In other embodiments, the pressure sensor 102 may also be a traditional air sensor. The sensing frequency of the pressure sensor 102 may be determined according to specific needs, for example, once every 0.01 second.

The workbench 300 can support the product 200 to be processed, and cooperate with the loading module 101 and the air extraction module 103 to perform the liquid loading and the air extraction operations to the product 200.

In the embodiment, the sensing connector is connected to the display 108, and the sensed pressure value can be displayed on the display 108. The display 108 can display the sensed pressure value in real time, so as to facilitate the monitoring of the pressure in the cavity 203 during the liquid loading or the air extraction processes. Referring to FIG. 2, in addition to the above components, the liquid loading device 100 further includes a controller 104, a memory 105, an I/O interface 106, and a communication bus 107. The controller 104 is coupled to the loading module 101, the pressure sensor 102, the air extraction module 103, the memory 105, the I/O interface 106, and a flow sensor 111 through the communication bus 107.

The flow sensor 111 is connected to the liquid outlet valve. The flow sensor 111 can sense the amount of the liquid loaded into the cavity 203 through the liquid outlet valve, and transmit the loading amount to the controller 104. The flow sensor 111 can be connected to the display 108, so that the loading amount can be displayed on the display 108. In another embodiment, the flow sensor 111 may further provide a loading time and a loading duration, which are then displayed on the display 108, thereby facilitating the monitoring of the flow during the liquid loading. The flow sensor 111 may be a portion of the liquid loading device 100 or of the loading module 101.

In another embodiment, the flow sensor 111 may not be directly connected to the display 108, but instead connected to the controller 104. The controller 104 is connected to the display 108. The controller 104 receives at least one data as to the loading amount, the loading time, and the loading duration, and displays the information on the display 108.

The loading amount of liquid into the cavity 203 may be characterized by volume or weight of the liquid. In one embodiment, the loading amount loaded into the cavity 203 and sensed by the flow sensor 111 is the volume of the liquid, the flow sensor 111 can also automatically calculate the weight of the liquid according to the density and the volume of the liquid. In another embodiment, the liquid loading device 100 may further include a weight sensor coupled to the controller 104. The weight sensor can sense the weight of the liquid loaded into the cavity 203, for example, by determining a difference between the weights of the liquid before and after being loaded into the cavity 203. The controller 104 can control the loading module 101 or the air extraction module 103 according to the weight of liquid.

After the pressure sensor 102 senses the pressure in the cavity 203 of the product 200 and generates the pressure value in the form of an electrical signal or a digital signal, the pressure sensor 102 further transmits the pressure value to the controller 104 through the communication bus 107. Thus, the controller 104 can control the operations of the loading module 101 or the air extraction module 103 according to the pressure value in the cavity 203. In addition, after the pressure value is transmitted to the controller 104, the controller 104 can also control the display 108 to display the pressure value.

In another embodiment, the pressure sensor 102 is coupled to the loading module 101. The loading module 101 further includes a first controller, and the pressure sensor 102 is coupled to the first controller. The loading module 101 can start to load or stop loading liquid according to at least one pressure value.

In another embodiment, the pressure sensor 102 is coupled to the air extraction module 103. The air extraction module 103 further includes a second controller, and the pressure sensor 102 is coupled to the second controller. The air extraction module 103 can start to extract or stop extracting air according to at least one pressure value.

It should be noted that the first controller and the second controller may be control devices independent of each other, or may be parts of the controller 104 integrated together in the controller 104.

It should be noted that the flow sensor 111, the pressure sensor 102, and the display 108 are optional.

The controller 104 can also be electrically connected to the liquid mixing valve 110, and control the liquid mixing pipe to open or close by controlling the liquid mixing valve 110, thereby allowing a specific type of liquid to enter the loading needle 11. The controller 104 can also be electrically connected to the liquid outlet valve, and control the loading needle 11 to start to load or stop loading liquid by controlling the liquid outlet valve to open or close. The controller 104 can also control the loading speed of the liquid from the loading needle 11 by controlling the flow rate of the liquid outlet valve.

In another embodiment, the controller 104 can also obtain the loading amount of the liquid loaded by the loading needle 11 according to the loading speed and the loading duration of loading the liquid to the cavity.

The controller 104 is also connected to the first driving member 112 to send a driving signal to the first driving member 112. The driving signal is to control the first driving member 112 to drive the conveying screw 1130 to rotate, thereby driving the liquid to flow towards the loading nozzle.

The controller 104 is also connected to the second driving member 114 to send a driving signal to the second driving member 114. The driving signal is to control the second driving member 114 to drive the blocking valve to block the liquid from flowing towards the loading nozzle, or to unblock the blocking valve so that the liquid can flow towards the loading nozzle.

The controller 104 is also coupled to the position sensor 115, and accurately controls the loading nozzle to move toward the liquid inlet 201 according to the positional relationship between the loading nozzle and the liquid inlet 201 sensed by the position sensor 115, such as the height between the loading nozzle and the liquid inlet 201, without scratching the product 200. Thus, the loading nozzle is prevented from scratching the product 200 due to a difference in the height between the loading nozzle and the liquid inlet 201 in different product batches.

The controller 104 can also calculate the loading duration, or obtain the loading time or the loading duration through the flow sensor 111.

The controller 104 controls the operations of the loading module 101 and the air extraction module 103 according to related data. The related data includes at least one of the loading duration, the loading amount of liquid into the cavity 203, and the pressure value in the cavity 203. The operations of the loading module 101 include at least one of the loading module 101 starting to load, continuing to load, accelerating the loading, decelerating the loading, or stopping the loading of liquid. The operations of the air extraction module 103 include at least one of the air extraction module 103 starting to extract, continuing to extract, accelerating the extracting, decelerating the extracting, or stopping the extracting of air.

The controller 104 may be a central processing unit (CPU), a microprocessor, an application-specific integrated circuit (ASIC), or one or more integrated circuits used to control the execution of the program of the present disclosure. In the embodiment, the controller 104 and the memory 105 are integrated in one chip, and the controller 104 is coupled to the loading module 101, the pressure sensor 102, the air extraction module 103, the memory 105, the I/O interface 106, and the flow sensor 111 through the communication bus 107. In other embodiments, the controller 104 and the memory 105 may be devices independent of each other, and the controller 104 may also be connected to the loading module 101, the memory 105, the pressure sensor 102, the air extraction module 103, the memory 105, the I/O interface 106, and the flow sensor 111 through a wireless network, such as wireless LAN, BLUETOOTH, near field communication (NFC), and WI-FI, thereby achieving data transmission and the control of the liquid loading and air extraction processes.

The memory 105 may be used to store preset information, the pressure value received by the controller 104, and the process information generated by the controller 104 during the liquid loading to the product 200. The memory 105 can be a read-only memory (ROM), other type of a static storage device that can store static information and instructions, a random access memory (RAM), other type of dynamic storage device that can store information and instructions, an electrically erasable programmable read-only memory (EEPROM), a compact disc read-only memory (CD-ROM), other optical disk storage (including compact disc, laser disc, optical disc, digital versatile disc, blue-ray disc, etc.), a magnetic disk storage media, other magnetic storage device, or any other media that can be used to carry or store desired program codes in the form of instructions or data structures and can be accessed by a computer. The memory 105 may be independent and connected to the controller 104 through the communication bus 107. The memory 105 may also be integrated together with the controller 104.

The communication bus 107 can form a channel for transmitting data between the controller 104 and the loading module 101 and between the pressure sensor 102 and the air extraction module 103.

The I/O interface 106 is a human-computer interaction interface of the liquid loading device 100, which can receive information input thereto and display the information. The I/O interface 106 may include an input interface and an output interface. The input interface communicates with the controller 104, and can receive the user input in a variety of ways. For example, the input interface can be a mouse, a keyboard, a touch screen device, or a sensor device. The output interface communicates with the controller 104, and can display information in a variety of ways. For example, the output interface can be a liquid crystal display (LCD), a light emitting diode (LED) display device, a cathode ray tube (CRT) display device, or a projector, etc.

Referring to FIG. 3, the detail structure and the application of the liquid loading device 100 are further described together with the liquid loading process performed by the liquid loading device 100.

It should be noted that the cavity 203 of the product 200 may include a plurality of the liquid inlets 201 and a plurality of the air outlets 202. The air extraction module 103 can extract air from the cavity 203 through a portion or all of the air outlets 202. The loading module 101 can load liquid into the cavity 203 through a portion or all of the liquid inlets 201. The embodiment describing one liquid inlet 201 and one air outlet 202 in the product 200 is an example for simplicity.

The product 200 is placed in a preset position on the workbench 300 before loading liquid. The workbench 300 may include a fixing assembly 20 to fix the product 200, thereby maintaining the product 200 at the specific position on the workbench 300 and preventing the product 200 from moving during the liquid loading process.

After the controller 104 determines that the product 200 has been fixed at the preset position, the controller 104 controls the air extraction module 103 to move to the air outlet 202 of the product 200, so that the air extraction nozzle 13 can extract air from the cavity 203 through the air outlet 202.

In the embodiment of the present disclosure, a small amount of air may exist in the loading needle 11 of the loading module 101 when working in a non-vacuum environment. The pressure in the cavity 203 is thus affected when the loading needle 11 is in contact with the liquid inlet 201. Therefore, in the embodiment, after the loading needle 11 moves and contacts the liquid inlet 201, the controller 104 does not control the loading needle 11 to immediately load liquid, but instead controls the air extraction module 103 to continue to extract air from the cavity 203 through the air extraction nozzle 13.

When the liquid is loaded, the loading nozzle of the loading module 101 cooperates with an elastic member. During the liquid loading process, the elastic member surrounds at least a portion of the outer wall of the loading nozzle, to cover the gap between the loading nozzle and the liquid inlet 201. Thus, certain sealing is formed between the loading nozzle and the liquid inlet 201. On the one hand, external air can be prevented from entering the cavity 203 through the liquid inlet 201. On the other hand, the liquid out of the loading needle 11 can be prevented from flowing to the periphery of the liquid inlet 201. The liquid in the cavity 203 can also be prevented from overflowing from the liquid inlet 201.

In an embodiment as shown in FIG. 3, the elastic member is an elastic membrane 12 that covers the liquid inlet 201. The thickness of the elastic membrane 12 is in a range between 1 mm and 5 mm. The controller 104 controls the loading needle 11 to penetrate the elastic membrane 12, and to load liquid into the cavity 203 through the liquid inlet 201.

In this case, the inner diameter of the loading needle 11 is equal to the diameter D1 of the needle port. The outer diameter D2 of the loading needle 11 is equal to a sum of the inner diameter D1 and the thickness of the needle wall of the loading needle 11. In the embodiment, the outer diameter D2 of the loading needle 11 is smaller than the diameter d of the liquid inlet 201. When the loading needle 11 penetrates the elastic membrane 12, the elastic membrane 12 tightly surrounds the outer wall of the loading needle 11, and at the same time covers the gap between the loading needle 11 and the liquid inlet 201. Thus, an airtight state is formed, which prevents the liquid from overflowing from the liquid inlet 201. The depth of the loading needle 11 penetrating through the elastic membrane 12 may be equal to the thickness of the elastic membrane 12, and the needle port of the loading needle 11 is disposed on the plane defined by the liquid inlet 201. As such, the liquid filling saturation can be increased as much as possible. Depending on the different structures of the liquid inlet 201 or different liquid loading requirements, the needle port of the loading needle 11 may also pass through the plane defined by the liquid inlet 201. In an embodiment, the tip of the loading needle 11, that is, the needle port, penetrates the elastic membrane 12. The tip of the loading needle 11 after penetrating the elastic membrane 12 is flush with a surface of the elastic membrane 12 facing the liquid inlet 201.

Figure 4:
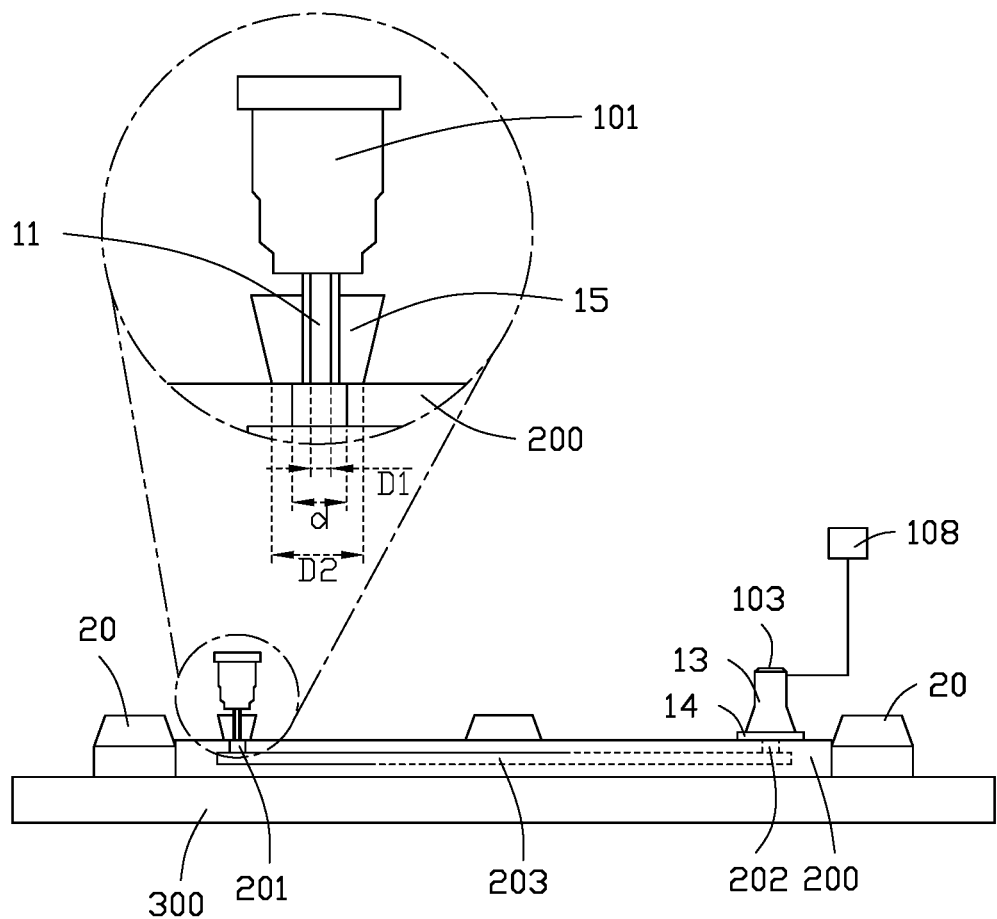
FIG. 4 is a side view of a liquid loading device according to another embodiment of the present disclosure.

In another embodiment, as shown in FIG. 4, the elastic member is an elastic sleeve 15, which is disposed on the loading needle 11 and surrounds the outer wall near the needle port. The controller 104 controls the loading needle 11 to move toward the liquid inlet 201, until the elastic sleeve 15 comes to be in contact with the liquid inlet 201 and resists the gap between the loading needle 11 and the liquid inlet 201. Then, the loading needle 11 loads liquid into the cavity 203 through the liquid inlet 201.

In this case, the inner diameter of the loading needle 11 is equal to the diameter D1 of the needle port. The outer diameter of the loading needle 11 is equal to the diameter D2 of the component composed of the loading needle 11 and the elastic sleeve 15. In the embodiment, the inner diameter D1 of the loading needle 11 is smaller than the diameter d of the liquid inlet 201. The elastic sleeve 15 needs to have a certain thickness, so that the outer diameter D2 of the component formed by the elastic sleeve 15 covering the outer diameter of the loading needle 11 is greater than the diameter d of the liquid inlet 201. As such, when the loading needle 11 moves toward the liquid inlet 201 to perform liquid loading, the elastic sleeve 15 can tightly surround the outer wall of the loading needle 11, and at the same time cover the gap between the loading needle 11 and the liquid inlet 201. Thus, an airtight state is formed, which can prevent the liquid from overflowing from the liquid inlet 201. In another embodiment, the inner diameter D1 of the loading needle 11 is greater than or equal to the diameter d of the liquid inlet 201, and the elastic sleeve 15 still needs to be disposed on the outer wall of the loading needle 11. An elastic portion (e.g., an elastic portion 16 in FIG. 5) can be attached to the plane defined by the periphery of the liquid inlet 201 during the liquid loading process, thereby improving the sealing effect.

Figure 5:
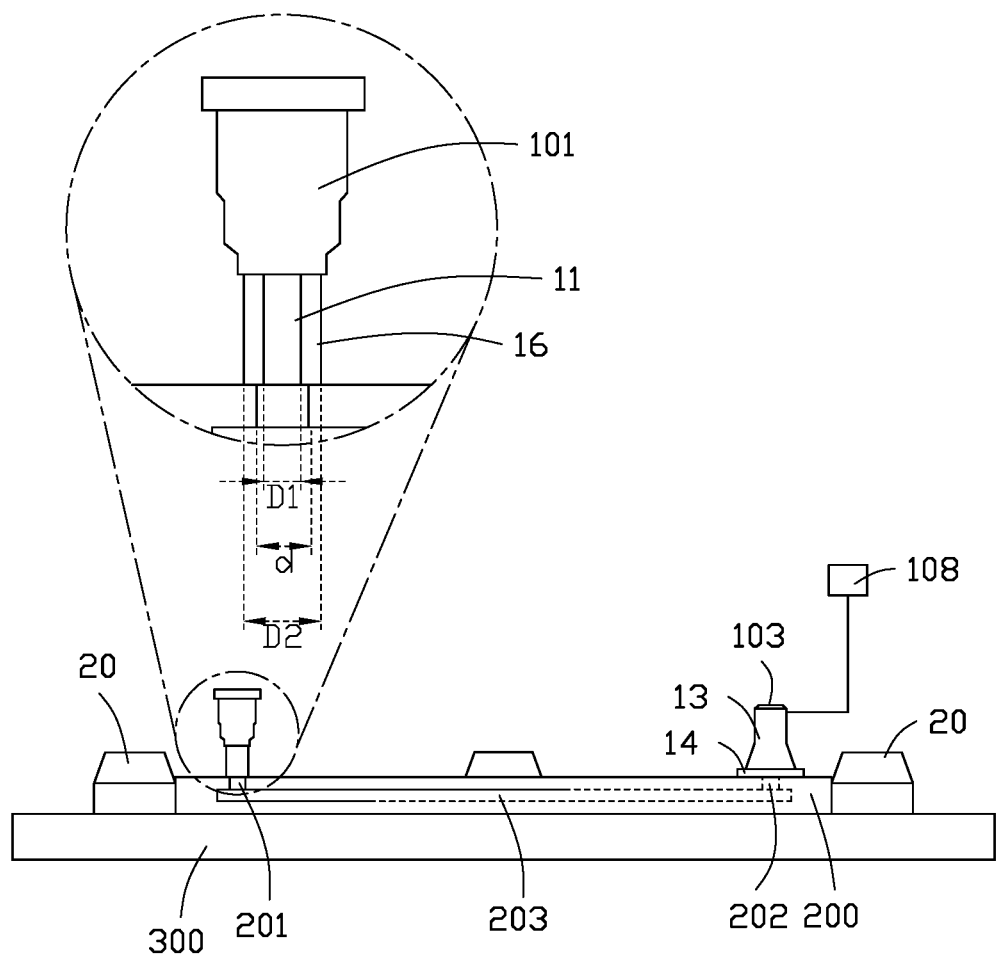
FIG. 5 is a side view of a liquid loading device according to yet another embodiment of the present disclosure.

As shown in FIG. 5, the loading needle 11 includes an elastic portion 16, which is near the needle port of the loading needle 11 and surrounds the outer wall of the loading needle 11 to form an integrated loading needle 11. The controller 104 controls the loading needle 11 to move toward the liquid inlet 201 and load liquid into the cavity 203 through the liquid inlet 201.

In this case, the inner diameter of the loading needle 11 is equal to the diameter D1 of the needle port, and the outer diameter of the loading needle 11 is equal to the diameter D2 of the needle port including the elastic portion 16. In the embodiment, the inner diameter D1 of the loading needle 11 is smaller than the diameter d of the liquid inlet 201. The elastic portion 16 needs to have a certain thickness, so that the outer diameter D2 of the loading needle 11 is greater than the diameter d of the liquid inlet 201. As such, when the loading needle 11 moves toward the liquid inlet 201, the elastic portion 16 can cover the liquid inlet 201. Thus, the sealing effect is improved, which can prevent the liquid from overflowing from the liquid inlet 201.

Each of the elastic portion 16 of the loading needle 11 and the elastic member used with the loading needle 11 (including the elastic membrane 12 or the elastic sleeve 15) may be made of an elastic material selected from a group consisting of plastic, rubber, silicone, and resin, and any combination thereof.

In the embodiment, the air extraction module 103 can operate with a breathable member (e.g., a breathable member 13a in FIG. 7) to extract air from the product 200. Specifically, during the air extraction process of the air extraction module 103, the breathable member is disposed between the air outlet 202 and the air extraction nozzle 13, and covers the air outlet 202 and the extraction opening of the air extraction nozzle 13. The air extraction module 103 extracts air from the cavity 203 through the breathable member and the air outlet 202.

In the embodiment as shown in FIG. 5, the breathable member is a breathable film 14. During the air extraction, the breathable film 14 first covers the air outlet 202. The air extraction nozzle 13 extracts air from the cavity 203 through the breathable film 14. To achieve better coverage, the surface area of the breathable film 14 is larger than the surface area of the air outlet 202, and is also larger than the surface area of the extraction opening of the air extraction nozzle 13.

Figure 6:
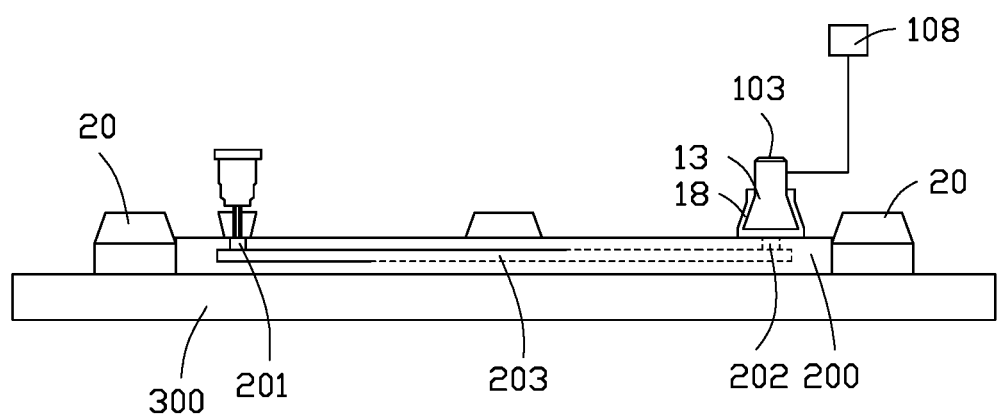
FIG. 6 is a side view of a liquid loading device according to yet another embodiment of the present disclosure.

In an embodiment as shown in FIG. 6, the breathable member may be a breathable sleeve 18. The breathable sleeve 18 is sleeved on the air extraction nozzle 13.

Figure 7:
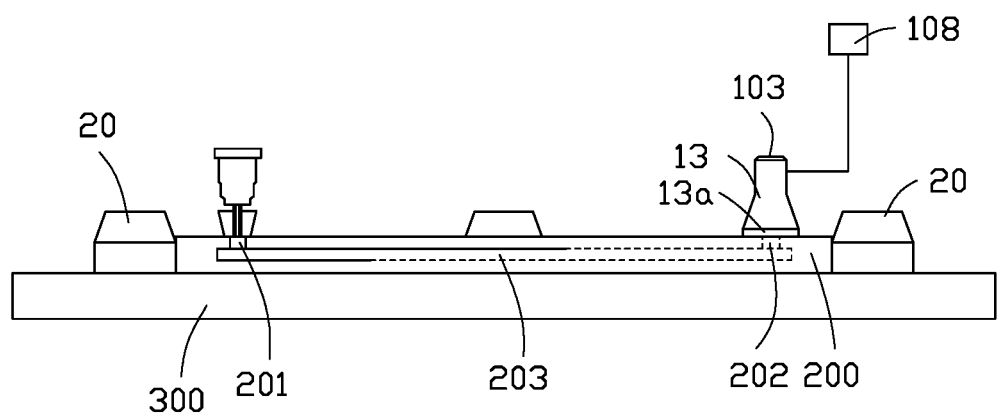
FIG. 7 is a side view of a liquid loading device according to yet another embodiment of to the present disclosure.

In another embodiment as shown in FIG. 7, the air extraction nozzle 13 includes a breathable member 13a. The breathable member 13a is a portion of the air extraction nozzle 13, and disposed at the extraction opening of the air extraction nozzle 13. The breathable member 13a can also be a film-shaped extraction opening, which is made of a breathable material. A separate breathable film is thus not needed.

The thickness of the breathable member is in a range between 0.01 mm and 0.2 mm. The air permeating rate of the breathable member is in a range between 1000 milliliters per minute and per square centimeter and 1500 milliliters per minute and per square centimeter (mL/min/cm$^2$). The breathable member may be made of polytetrafluoroethylene.

The cooperation of the air extraction module 103 and the breathable member can prevent the liquid in the cavity 203 from entering the air extraction nozzle 13 through the air outlet 202 during the air extraction process. On the other hand, since the breathable film 14 has a certain air permeability, the air extraction nozzle 13 can extract air through the breathable film 14.

In the embodiment, the controller 104 controls the air extraction module 103 to move toward the air outlet 202 of the product 200, until the air extraction nozzle 13 contacts the breathable film 14 and communicates with the air outlet 202 through the breathable film 14. Then, the air in the cavity 203 can be extracted out.

It should be noted that the product 200 may also be placed in a vacuum environment during the liquid loading. Specifically, the product 200 may be processed in a work space. The air extraction module 103 does not directly extract air from the cavity 203 of the product 200, but instead extracts air from the work space. That is, air in the cavity 203 of the product 200 is indirectly extracted out. After air in the work space is extracted out by the air extraction module 103, a negative pressure with respect to the outside environment is formed in the work space where the product 200 is disposed.

In the embodiment, when the controller 104 controls the loading module 101 to load liquid into the cavity 203 through the liquid inlet 201, the controller 104 also controls the air extraction module 103 to simultaneously extract air from the cavity 203 through the air outlet 202. Air flow is formed in the cavity 203 through the air extraction. On one hand, the loaded liquid can flow to infill the cavity 203 more smoothly. On the other hand, the air in the loaded liquid can be discharged as much as possible to improve the filling saturation of the cavity 203. In other embodiments, according to the liquid loading requirements, the controller 104 may control the air extraction module 103 to perform extractions at intervals, only for a certain duration, or stop extraction after determining that the pressure value in the cavity 203 reaches a preset pressure value.

In the embodiment, when the loading module 101 loads liquid, the pressure sensor 102 continuously senses the pressure in the cavity 203, generates a first negative pressure value in the form of an electrical signal or a digital signal, and sends the first negative pressure value to the controller 104. The controller 104 receives the first negative pressure value from the pressure sensor 102 through the communication bus 107. When the first negative pressure value matches a first preset condition, the controller 104 controls the loading module 101 to stop loading liquid into the cavity 203, and also controls the air extraction module 103 to stop extracting air.

Normally, when the liquid is stably loaded into the cavity 203, the pressure value in the cavity 203 may slightly fluctuate. When the liquid almost completely infills the cavity 203, the pressure value in the cavity 203 may suddenly change. Accordingly, the pressure value sensed and generated by the pressure sensor 102 may suddenly change. In the embodiment, the first negative pressure value sensed by the pressure sensor 102 is the pressure value after a sudden change, which may be in a range between minus 84 and minus 98 kPa. The controller 104 may record the pressure value from the pressure sensor 102 according to a certain rule or a certain period. The controller 104 may also record the pressure value received every time. When a difference between the received first negative pressure value and the previous pressure value reaches or exceeds a threshold of pressure value differences, or when a pressure change rate, which is obtained according to the first negative pressure value, the previous pressure value, and the durations of the two pressures, matches a preset range of pressure change rates, the air extraction module 103 is controlled to stop extracting air.

Specifically, when the threshold of pressure value differences is 1.5 kPa, for example, the pressure sensor 102 senses the pressure in the cavity 203 every 0.01 second, and generates and sends the pressure value in the form of an electrical signal or a digital signal to the controller 104. The controller 104 records the pressure value received each time. The pressure sensor 102 senses and generates a pressure value of minus 82 kPa at 00:00:05 (hour:minute:second), and senses and generates a pressure value of minus 85 kPa at 00:00:06 (hour:minute:second). After the controller 104 receives the pressure value of minus 85 kPa from the pressure sensor 102, the controller 104 calculates the pressure value difference to be 3 kPa according to the previous pressure value of negative 82 kPa. Since the pressure value difference is determined to exceed the threshold of pressure value differences of 1.5 kPa, the air extraction module 103 is controlled to stop the air extraction. In another embodiment, the preset range of pressure change rates is from 280 kPa per second to 600 kPa per second. The controller 104 can also calculate the pressure change rate to be 300 kPa per second, according to minus 85 kPa, minus 82 kPa, and the duration of 0.1 second for the two pressure values. Since the pressure change rate matches the preset range of pressure change rates, the air extraction module 103 is controlled to stop the air extraction. It is understandable that a threshold of pressure change rate, instead of the preset range of pressure change rates, can also be preset.

In yet another embodiment, a reference value of the first negative pressure value can also be preset in the memory 105. The reference value is used to determine whether the liquid has completely infilled the cavity 203. When the pressure value sensed by the pressure sensor 102 is equal to or less than the reference value of the first negative pressure value, the controller 104 determines that the liquid has almost infilled or completely infilled the cavity 203, and then controls the air extraction module 103 to stop the air extraction. It should be noted that the reference value of the first negative pressure value can be obtained by performing various historical liquid loading processes, and calculating an average value of the pressure values after the sudden change sensed by the pressure sensor 102 each time the liquid has completely infilled the cavity.

Since the controller 104 controls the loading module 101 to stop loading liquid based on the first negative pressure value sensed and sent by the pressure sensor 102, the time delay from the liquid completely filling the cavity 203 to the stopping of the liquid loading is greatly shortened. Thus, the loading module 101 is prevented from continuing to load liquid after the liquid has completely infilled the cavity 203. Liquid overflow from the liquid inlet 201 can thus be avoided.

Figure 8:
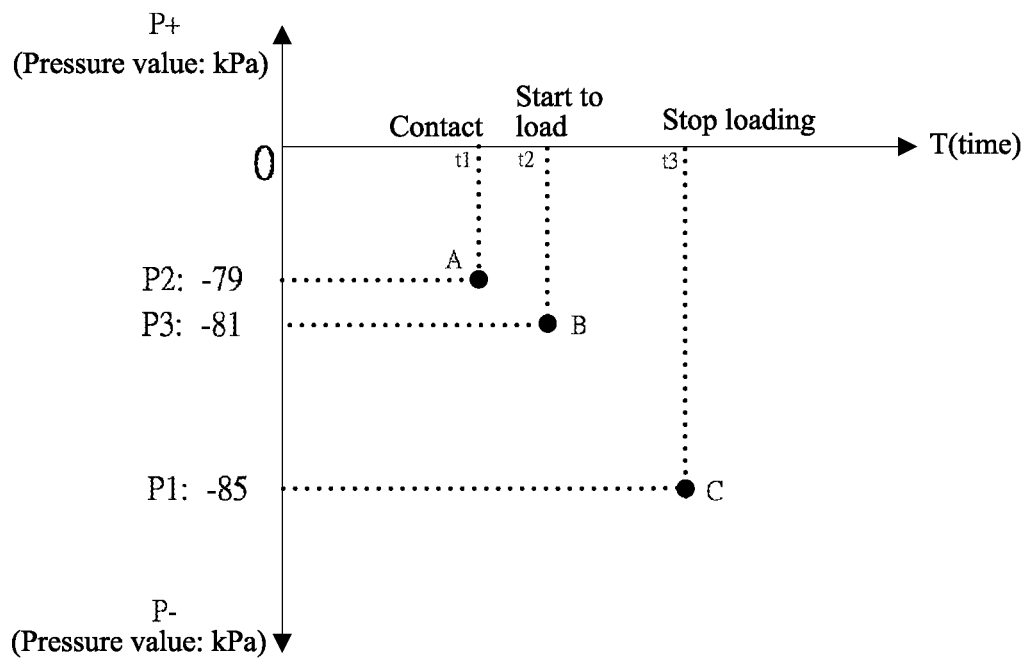
FIG. 8 is a diagram of pressure values changing over time according to an embodiment of the present disclosure.

FIG. 8, which is a diagram of the pressure values changing over time in the embodiment, is provided to better illustrate the control process of the controller 104. First, the air extraction module 103 extracts air from the cavity 203. Then, the pressure sensor 102 converts the sensed pressure into a second negative pressure value in the form of an electrical signal or a digital signal, and transmits it to the controller 104. At time point t1, which corresponds to point A in the FIG. 8, the second negative pressure value reaches a second preset pressure value P2 of minus 79 kPa. Since the second negative pressure value matches the second preset pressure value P2, the controller 104 controls the loading module 101 to make contact with the liquid inlet 201, and controls the air extraction module 103 to continue the air extraction. The pressure sensor 102 continuously senses the pressure in the cavity 203, converts the pressure into a third negative pressure value in the form of an electrical signal or a digital signal, and transmits it to the controller 104. At time point t2, which corresponds to point B in the figure, the third negative pressure value reaches a third preset pressure value P3 of minus 81 kPa. Since the third negative pressure value matches the third preset pressure value P3, the controller 104 controls the loading module 101 to load liquid into the cavity 203 through the liquid inlet 201, and controls the air extraction module 103 to extract air from the cavity 203 through the air outlet 202. The pressure sensor 102 continuously senses the pressure in the cavity 203, converts the pressure into a first negative pressure value in the form of an electrical signal or a digital signal, and transmits it to the controller 104. At time point t3, which corresponds to point C in the figure, the first negative pressure value reaches a first preset pressure value P1 of minus 85 kPa. Since the first negative pressure value matches the first preset pressure value P1, the controller 104 controls the loading module 101 to stop loading liquid into the cavity 203.

In another embodiment, the controller 104 can also control the operations of the loading module 101 and the air extraction module 103 according to the duration. First, when the controller 104 controls the air extraction module 103 to extract air from the cavity 203, the time point t0 when air extraction starts is recorded. When the air extraction lasts for a first duration, the time point t0 becomes t1 after the first duration. At time point t1, the controller 104 controls the loading module 101 to move toward the liquid inlet 201 and contact the liquid inlet 201 since the duration of the air extraction reaches the first duration, and at the same time controls the air extraction module 103 to continue extracting air. The air extraction further continues for a second duration, and the time point t1 becomes t2 after the second duration. At time point t2, since the duration for the air extraction after the first duration has reached the second duration, the controller 104 controls the loading module 101 to load liquid to the cavity 203 through the liquid inlet 201 and synchronously controls the air extraction module 103 to extract air from the cavity 203 through the air outlet 202.

Specifically, the first duration and the second duration can be preset in the memory 105. The controller 104 can read the first duration and the second duration from the memory 105, which can be used to control the operations of the loading module 101 and the air extraction module 103. For example, the first duration is 10 seconds, which means that after the air extraction module 103 first contacts the air outlet 202 and starts the air extraction, the air extraction module 103 is required to continue the air extraction operation for 10 seconds. The second duration is 5 seconds, which means that after the loading module 101 contacts the air inlet 201, the air extraction module 103 is required to continue the air extraction operation for 5 seconds.

When the controller 104 controls the air extraction module 103 to contact the air outlet 202 and start to extract air from the cavity 203, the timing is started, for example, to record the time point t0 when the air extraction starts, and t0 is 00:00:00 (hour:minute:second). After the air extraction module 103 continues to extract air for 10 seconds, the time becomes t1 of 00:00:10, and the first extracting duration is t1−t0, that is, 10 seconds. Since the extracting duration reaches the preset first duration of 10 seconds, the controller 104 controls the loading module 101 to move toward and contact the liquid inlet 201, and at the same time controls the air extraction module 103 to continuously extract air. When the air extraction module 103 continues to extract air for another 5 seconds, the time changes from t1 to t2, that is, to 00:00:15, and the second extracting duration is t2−t1, that is, 5 seconds. Since the second extracting duration reaches the preset second duration of 5 seconds, the controller 104 controls the loading module 101 to start to load liquid to the cavity 203 through the liquid inlet 201, and at the same time controls the air extraction module 103 to continuously extract air from the cavity 203 through the air outlet 202.

In other embodiments, the controller 104 can also control the operations of the loading module 101 and the air extraction module 103 according to the pressure value and the duration. For example, the controller 104 can control the loading module 101 to contact the liquid inlet 201 based on the pressure value from the pressure sensor 102, and then control the loading module 101 to start to load liquid based on the extracting duration.

Normally, during the liquid loading process, the pressure in the cavity 203 may change, for example, the negative pressure value may continue to drop down. The controller 104 can also control the loading speed of the loading module 101 based on the pressure change rate in the cavity 203. Specifically, the controller 104 controls the loading module 101 to start to load liquid into the cavity 203 based on the third negative pressure value from the pressure sensor 102, and records the negative pressure value in the cavity 203 as the third negative pressure value. During the liquid loading process, after a duration Δt for example, the pressure sensor 102 senses the pressure in the cavity 203, generates a fifth negative pressure value in the form of an electrical signal or a digital signal, and transmits it to the controller 104. The controller 104 obtains the pressure change rate in the cavity 203 according to the third negative pressure value, the fifth negative pressure value, and the duration Δt, and further determines whether to adjust the loading speed of the loading module 101 according to the pressure change rate. For example, if the pressure change rate is higher than the preset threshold, the loading speed may be too fast, hindering the extraction of the air in the cavity 203 or in the liquid. At this time, the controller 104 can control the loading module 101 to slow down the loading speed. It is understandable that the controller 104 can record multiple pressure values from the pressure sensor 102 according to actual needs, and then calculate the loading speed accordingly.

In the embodiment, the controller 104 controls the loading module 101 to start to load liquid into the cavity 203 based on the third negative pressure value from the pressure sensor 102, and can also record the time point t2 at this time. During the liquid loading process, the pressure sensor 102 senses the pressure in the cavity 203, generates a fourth negative pressure value in the form of an electrical signal or a digital signal, and transmits it to the controller 104. The controller 104 receives the fourth negative pressure value, and records the time point t4 to obtain the duration of the loading module 101 loading the liquid, that is, the duration Δt from time point t2 to time point t4. The controller 104 controls the loading module 101 to stop loading liquid into the cavity 203 when the duration Δt reaches or exceeds the preset duration threshold and the fourth negative pressure value is greater than the first negative pressure value.

Specifically, the duration threshold allowing for the liquid loading can be preset in the memory 105. For example, the duration threshold is 20 seconds, which means that the duration allowing for the loading module 101 to load liquid each time cannot exceed 20 seconds. The reference value of the first negative pressure value can also be preset in the memory 105. In the embodiment, when the liquid completely infills the cavity 203 under normal circumstances, the pressure sensor 102 senses that the pressure in the cavity 203 suddenly changes to minus 85 kPa, for example. That is, if the sensed pressure value in the cavity 203 is always less than minus 85 kPa, there is a high probability that the liquid has not completely infilled the cavity 203. Therefore, minus 85 kPa can be used as the reference value of the first negative pressure value. The controller 104 can monitor the liquid filling condition according to the reference value of the first negative pressure value and the pressure value sensed by the pressure sensor 102 during the liquid loading process. The controller 104 can read the duration threshold and the reference value of the first negative pressure value from the memory 105, which can be used to control the operations of the loading module 101 and the air extraction module 103.

When the controller 104 controls the loading module 101 to start to load liquid into the cavity 203 through the liquid inlet 201, it is the time for example, to record the time point t2 when the liquid loading starts, and t2 is 00:00:15. The loading module 101 continues to load liquid for 20 seconds, and the time point becomes t3, that is, 00:00:35, and the duration for the loading liquid is t3−t2, that is, 20 seconds. During the liquid loading, the pressure sensor 102 can sense the pressure in the cavity 203 at a certain frequency, generate the pressure value in the form of an electrical signal or a digital signal, and transmit it to the controller 104. The controller 104 records the pressure value after receiving the pressure value. For example, at time point t3, the controller 104 receives the fourth negative pressure value from the pressure sensor 102, which is minus 82 kPa. Since the duration of 20 seconds for liquid loading reaches the preset duration threshold of 20 seconds, and the fourth negative pressure value of minus 82 kPa is greater than the reference value of the first negative pressure value of minus 85 kPa, the controller 104 controls the loading module 101 to stop loading liquid into the cavity 203. It should be noted that the controller 104 can also control the loading module 101 to stop loading liquid into the cavity 203 only when the duration of 20 seconds for liquid loading reaches the preset duration threshold of 20 seconds.

In another embodiment, the controller 104 controls the loading module 101 to start to load liquid into the cavity 203 based on the third negative pressure value from the pressure sensor 102, and also records the total loading amount of the liquid loaded by the loading module 101. When the total loading amount reaches a preset amount threshold and the fourth negative pressure value is greater than the first negative pressure value, the controller 104 controls the loading module 101 to stop loading liquid into the cavity 203. It should be noted that the controller 104 can also control the loading module 101 to stop loading liquid into the cavity 203 only when the total loading amount reaches the preset amount threshold.

When the loading duration or the total loading amount of the loading module 101 exceeds the threshold, but the pressure in the cavity 203 does not reach the first negative pressure value, the cavity 203 of the product 200 may have a leak. By monitoring the loading duration or the total loading amount, low processing efficiency of the liquid loading device 100 and liquid waste caused by defects of the product 200 can be avoided.

The controller 104 controls the loading module 101 to stop loading liquid into the cavity 203 when the first negative pressure value from the pressure sensor 102 matches the first preset pressure value. Since the loaded liquid is not completely stable, the controller 104 further controls the loading module 101 and the air extraction module 103 to respectively maintain contact with the liquid inlet 201 and the air outlet 202, so as to maintain the pressure in the cavity 203 for a certain duration. Thus, an uneven distribution of the liquid in the cavity 203, which is caused by the sudden change of the pressure value in the cavity 203, can be avoided. In the embodiment, the duration for maintaining the pressure may be 1 second to 5 seconds.

After maintaining the pressure, depending on the type of the product 200 or the type of the loaded liquid, the product 200 can be cured according to actual needs.

In some embodiments, the controller 104 controls the operations of the loading module 101 and the air extraction module 103 according to related data. The related data includes at least one of the duration, the loading amount of the liquid into the cavity 203, and the pressure value in the cavity 203. The operations of the loading module 101 include at least one of the loading module 101 starting to load, continuing to load, accelerating the loading, decelerating the loading, and stopping the loading of liquid. The operations of the air extraction module 103 include at least one of the air extraction module 103 starting to extract, continuing to extract, accelerating the extracting, decelerating the extracting, and stopping the extracting of air.

In an embodiment, the controller 104 may control the operations of the loading module 101 and the air extraction module 103 according to the duration. The duration includes the extracting duration and the loading duration for loading liquid into the cavity 203. The memory 105 stores a preset loading duration and a preset extracting duration. The controller 104 uses the preset loading duration as a judging standard of the duration for the loading module 101 to continuously load liquid into the cavity 203, and uses the preset extracting duration as a judging standard of the duration for the air extraction module 103 to continuously extract air from the cavity 203.

Figure 9:
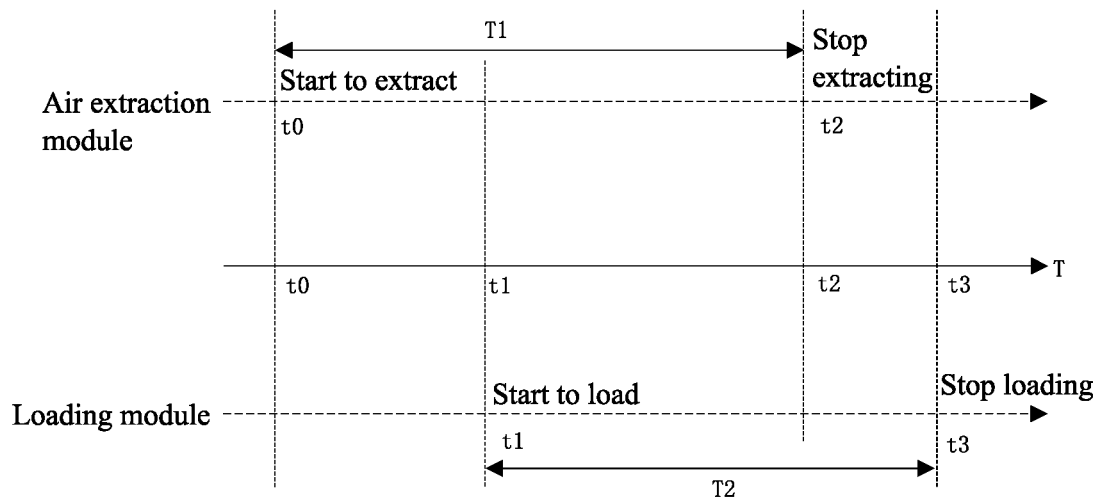
FIG. 9 is a diagram illustrating operations of an air extraction module and a loading module changing over time according to an embodiment of the present disclosure.

For example, as shown in FIG. 9, the controller 104 first controls the air extraction module 103 to extract air from the cavity 203, and also records the time point t0 when the air extraction starts. The air extraction continues for the extracting duration of T1, and the time point t0 becomes t2 after the extracting duration. At time point t2, since the extracting duration T1 (being equal to t2−t0) reaches the preset extracting duration, the controller 104 controls the air extraction module 103 to stop extracting air (denoted as a first moment). Then, the controller 104 controls the loading module 101 to load liquid into the cavity 203, and also records the time point t1 when the liquid loading starts. The liquid loading continues for the loading duration T2, and the time point t1 becomes t3. At time point t3, since the loading duration T2 (being equal to t3−t1) reaches the preset loading duration, the controller 104 controls the loading module 101 to stop loading liquid (denoted as a second moment). In the embodiment, the time point t1 when liquid loading starts is later than the time point t0 when the air extraction starts, and the time point t3 when the liquid loading stops is later than the time point t2 when the air extraction stops. That is, the start moment of liquid loading (t1, a fourth moment) is later than the start moment of air extraction (t0, a third moment), and the stop moment of liquid loading t3 is later than the stop moment of air extraction t2, which means that the second moment is later than the first moment. Thus, air in the cavity 203 is started to be extracted out before liquid is loaded into the cavity 203 (at time point t1), which is benefit for the liquid loading. Also, air extraction in the cavity 203 is stopped before the loading liquid is stopped (at time point t3). Thus, when the breathable member between the air extraction nozzle 13 and the air outlet 202 is absent, the liquid, which is loaded into the cavity 203, can be prevented from being drawn into the air extraction nozzle 13 through the air outlet 202 to block the air extraction nozzle 13.

For example, the controller 104 controls the air extraction module 103 to extract air from the cavity 203, and also records the time point t0 when air extraction starts, for example, t0 is 00:00:00 (hour:minute:second). The air extraction continues for an extracting duration T1 of 5 seconds, for example, and the time point t0 becomes t2 after 5 seconds, that is, t2 is 00:00:05. At time point t2, the controller 104 controls the air extraction module 103 to stop extracting air since T1 reaches the preset extracting duration of 5 seconds. Then, the controller 104 controls the loading module 101 to load liquid into the cavity 203, and also records the time point t1 when the liquid loading starts, and t1 is 00:00:01, for example. The liquid loading continues for a loading duration T2 of 8 seconds, for example, and the time point t1 becomes t3 of 00:00:09. At time point t3, the controller 104 controls the loading module 101 to stop loading liquid since the loading duration T2 reaching the preset loading duration of 8 seconds. In the embodiment, the time point t1 (the fourth moment) when the loading operation starts is later than the time point t0 (the third moment) when the air extraction starts, and the time point t3 (the second moment) when the liquid loading stops is later than the time point t2 (the first moment) when the air extraction stops. That is, the start moment of the liquid loading is later than the start moment of the air extraction, and the stop moment of the liquid loading is later than the stop moment of the air extraction.

Figure 10:
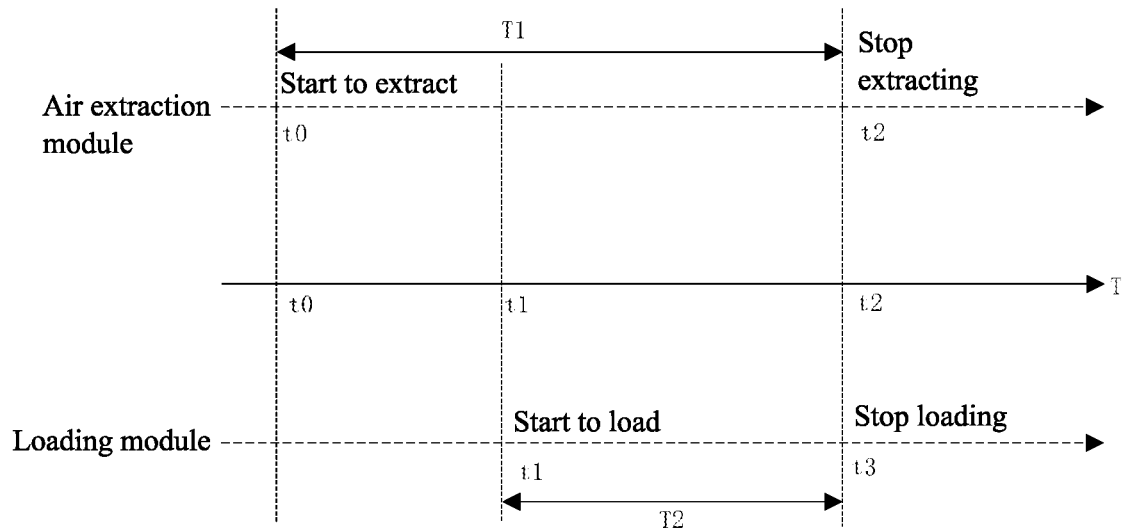
FIG. 10 is a diagram illustrating operations of an air extraction module and a loading module changing over time according to another embodiment of the present disclosure.

In another embodiment, as shown in FIG. 10, the time point t1 when the liquid loading starts is later than the time point t0 when the air extraction starts, and the time point t3 when the liquid loading stops is the same as the time point t2 when the air extraction stops. Thus, air in the cavity 203 is extracted out before liquid is loaded into the cavity 203 (at time point t1), which is benefit for the liquid loading. Also, air extraction in the cavity 203 is stopped while liquid loading is stopped (at time point t3), which can avoid disturbing of the loaded liquid. Thus, the air extraction module 103 is prevented from extracting the liquid to the air outlet 202 to block or even overflow through the air outlet 202. In other embodiments, the time point t1 when the liquid loading starts and the time point t0 when the air extraction starts may also be the same, and the time point t3 when the liquid loading stops and the time point t2 when the air extraction stops may be the same (not shown in the figures). The time point t1 when the liquid loading starts may also be earlier than the time point t0 when the air extraction starts, and the time point t3 when the liquid loading stops may be later than the time point t2 when the air extraction stops (not shown in the figures).

In another embodiment, the air extraction module 103 cooperates with the breathable member, and when the controller 104 controls the air extraction module 103 to stop the air extraction according to the extracting duration, the stop moment of the air extraction may be later than the stop moment of the liquid loading. For example, the preset duration from the stop moment of the liquid loading to the stop moment of the air extraction is T0. The controller 104 records the time point t0 when the liquid loading stops. At the time point t0+T0, since the air extraction lasts for the duration T0 after the liquid loading stops, the controller 104 controls the air extraction module 103 to stop the air extraction. Since the air extraction has been performed for the duration after the liquid loading stops, an improved filling saturation of the liquid in the cavity 203 can be obtained. It is understandable that the controller 104 can also control the air extraction module 103 to stop extracting air according to other durations. For example, the preset extracting duration T1, the preset loading duration T2, and T1 is greater than T2. The controller 104 controls the air extraction module 103 to stop the air extraction according to T1, and the stop moment of the air extraction is later than the stop moment of the liquid loading.

In another embodiment, the controller 104 can also control the operations of the loading module 101 and the air extraction module 103 according to the duration and the loading amount. The memory 105 stores a preset extracting duration and a preset loading amount. For example, the controller 104 controls the air extraction module 103 to extract air from the cavity 203, and also records the time point t0 when the air extraction starts. The air extraction continues for the extracting duration T1, and the time point t0 becomes t2 after the extracting duration T1. At time point t2, since the extracting duration T1 reaches the preset extracting duration, the controller 104 controls the air extraction module 103 to stop the air extraction. When the controller 104 controls the loading module 101 to load liquid into the cavity 203, the flow sensor 111 senses a loading amount V of the loaded liquid into the cavity 203. When the loading amount V reaches a preset loading amount V0, the loading module 101 is controlled to stop loading liquid.

In yet another embodiment, the air extraction module 103 cooperates with the breathable member. The memory 105 stores a preset extracting duration and a preset loading amount, and the preset extracting duration is equal to a duration T1 that the air extraction is continued after the liquid loading stops. When the controller 104 controls the loading module 101 to load liquid into the cavity 203, the flow sensor 111 senses the loading amount V of the loaded liquid into the cavity 203. When the loading amount V is determined to reach the preset loading amount V0, the loading module 101 is controlled to stop the liquid loading. When the air extraction lasts for the duration T1 after the liquid loading stops, the controller 104 controls the air extraction module 103 to stop the air extraction. Since the air extracting lasts for a preset duration (the preset extracting duration) after the liquid loading stops, the distribution of the liquid in the cavity 203 before curing can be improved, and the air in the cavity 203 can be removed before liquid is cured, which can increase the impact resistance of the product 200.

In yet another embodiment, the controller 104 can also control the operations of the air extraction module 103 according to the extracting duration, and control the operations of the loading module 101 according to the pressure value. The memory 105 stores a preset extracting duration and a seventh preset pressure value. The controller 104 uses the preset extracting duration as a judging standard of the duration for the air extraction module 103 to continuously extract air, and uses the seventh preset pressure value as a judging standard for controlling the loading module 101 to start the liquid loading. For example, the controller 104 controls the air extraction module 103 to extract air from the cavity 203, and also records the time point t0 when the air extraction starts. The air extraction continues for the extracting duration T1, and the time point t0 becomes t2 after the extracting duration T1. At time point t2, since the extracting duration T1 reaches the preset extracting duration, the controller 104 controls the air extraction module 103 to stop the air extraction. Then, the loading module 101 loads the liquid into the cavity 203, and the pressure sensor 102 senses a seventh negative pressure value in the cavity 203 having the liquid loaded therein. Since the seventh negative pressure value reaches the seventh preset pressure value, the controller 104 controls the loading module 101 to start to load liquid into the cavity 203. In another embodiment, the memory 105 stores a preset extracting duration and a seventh preset pressure value. The seventh preset pressure value is used as a judging standard for the controller 104 to control the loading module 101 to stop the liquid loading. The controller 104 controls the air extraction module 103 to stop extracting air from the cavity 203 based on the preset extracting duration, and controls the loading module 101 to stop the liquid loading based on the seventh preset pressure value. The liquid loading is controlled in the embodiment based on the pressure value in the cavity 203, which avoids insufficient filling in the cavity 203 caused by an inconsistency (tolerance) of the cavity 203.

In another embodiment, the memory 105 stores a preset extracting duration, a third preset pressure value, and a first preset pressure value. The controller 104 uses the preset extracting duration as a judging standard of the duration for the air extraction module 103 to continuously extract air. The third preset pressure value is used as a judging standard for controlling the loading module 101 to start the liquid loading. The first preset pressure value is used as a judging standard for controlling the loading module 101 to stop the liquid loading. For example, the controller 104 controls the air extraction module 103 to extract air from the cavity 203, and also records the time point t0 when the air extraction starts. The air extraction continues for the extracting duration T1, and the time point t0 becomes t2 after the extracting duration T1. At time point t2, since the extracting duration T1 reaches the preset extracting duration, the controller 104 controls the air extraction module 103 to stop the air extraction. When the loading module 101 loads the liquid into the cavity 203, the pressure sensor 102 senses the third negative pressure value in the cavity 203 having the liquid loaded therein. When the third negative pressure value reaches the third preset pressure value, the controller 104 controls the loading module 101 to start to load liquid into the cavity 203. The loading module 101 continues to load liquid for a duration, and the pressure sensor 102 continues to sense the pressure value in the cavity 203 having the liquid loaded therein to generate a first negative pressure value. When the first negative pressure value reaches the first preset pressure value, the controller 104 controls the loading module 101 to stop loading liquid into the cavity 203. In the embodiment, the time point of the controller 104 controlling the loading module 101 to start to load liquid into the cavity 203 is earlier than time point t2, and the time point of stopping loading liquid into the cavity 203 is later than time point t2. In other embodiments, the time point of the controller 104 controlling the loading module 101 to stop loading liquid into the cavity 203 may also be earlier than the time point t2. The liquid loading is controlled in the embodiment based on the pressure value in the cavity, which avoids insufficient filling in the cavity caused by an inconsistency (tolerance) of the cavity.

Figure 11:
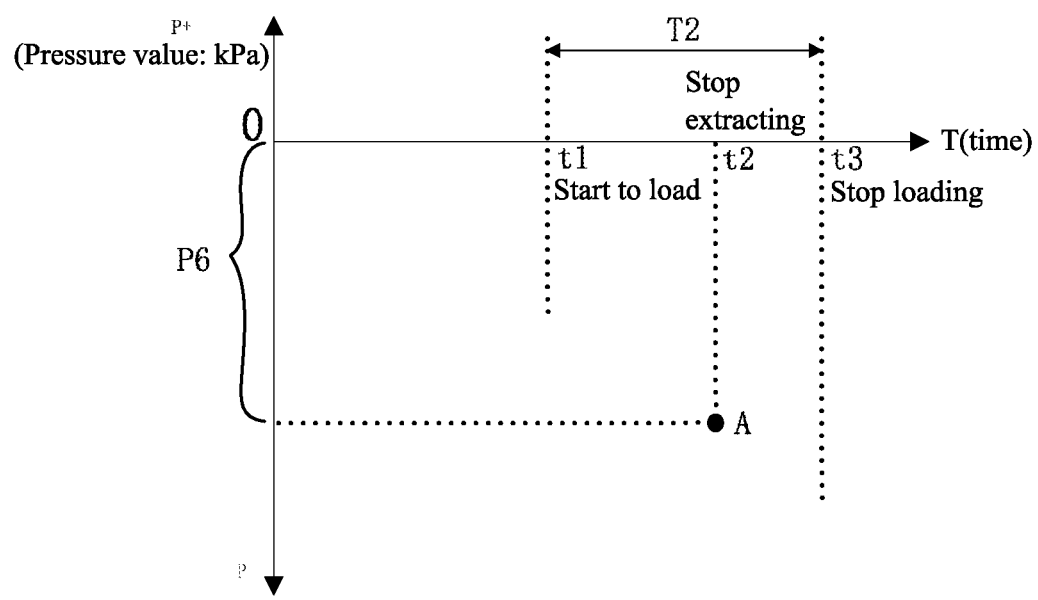
FIG. 11 is a diagram illustrating operations of an air extraction module and a loading module changing over time according to yet another embodiment of the present disclosure.

In another embodiment, the controller 104 can also control the operations of the air extraction module 103 according to the pressure value, and control the operations of the loading module 101 according to the loading duration. The memory 105 stores a preset loading duration and a sixth preset pressure value. The controller 104 uses the preset loading duration as a judging standard of the duration of the loading module 101 continuously loading liquid, and uses the sixth preset pressure value as a judging standard for controlling the air extraction module 103 to stop the air extraction. For example, as shown in FIG. 11, the controller 104 first controls the loading module 101 to load liquid into the cavity 203, and also records the time point t1 when the liquid loading starts. The liquid loading continues for the loading duration T2, and the time point t1 becomes t3. At time point t3, the controller 104 controls the loading module 101 to stop the liquid loading since the loading duration T2 reaches the preset loading duration. When the controller 104 controls the loading module 101 to load liquid into the cavity 203, the pressure sensor 102 senses a sixth negative pressure value in the cavity 203. When the sixth negative pressure value reaches the sixth preset pressure value, that is, at time point t2 (corresponding to point A in the figure), the controller 104 controls the air extraction module 103 to stop the air extraction. In the embodiment, the time point when the air extraction module 103 starts the air extraction may be earlier than the time point t1 or later than the time point t1. The time point when the extracting stops is later than the time point t1 and earlier than the time point t3.

In the embodiment, the sixth preset pressure value can be the pressure value in the cavity 203 at which all the air is extracted out. Since the pressure value is used to determine when the air extraction module 103 stops the air extraction, certainty as to the extraction of all the air is conferred, thereby preventing air from being mixed into the liquid to reduce the impact resistance of the product 200. It is understandable that the air extraction module 103 can cooperate with the breathable member, and the time point when the air extraction stops may be later than the time point t3.

In another embodiment, the controller 104 can also control the operations of the air extraction module 103 according to the pressure value, and control the operations of the loading module 101 according to the loading amount. For example, the controller 104 first controls the loading module 101 to load liquid into the cavity 203, and controls the air extraction module 103 to extract air before or after the liquid loading starts. At the same time, the flow sensor 111 is controlled to sense the loading amount V of the loaded liquid into the cavity 203. When the loading amount V reaches the preset loading amount V0, the loading module 101 is controlled to stop the liquid loading. When the controller 104 controls the loading module 101 to load liquid into the cavity 203, the pressure sensor 102 also senses the sixth negative pressure value in the cavity 203. When the sixth negative pressure value reaches the sixth preset pressure value, the controller 104 controls the air extraction module 103 to stop the air extraction.

In another embodiment, the controller 104 can also control the operations of the air extraction module 103 and the loading module 101 according to the pressure value. Specifically, the pressure sensor 102 senses the pressure in the cavity 203 and generates at least one pressure value. The at least one pressure value includes a sixth negative pressure value, a third negative pressure value, and a first negative pressure value. The controller 104 controls the loading module 101 to start to load or stop loading liquid according to the third negative pressure value and the first negative pressure value. The memory 105 stores a sixth preset pressure value, a third preset pressure value, and a first preset pressure value. The controller 104 uses the third preset pressure value as a judging standard for controlling the loading module 101 to start the liquid loading. The sixth preset pressure value is used as the judging standard for controlling the air extraction module 103 to stop the air extraction. The first preset pressure value is used as the judging standard for controlling the loading module 101 to stop the liquid loading.

Figure 12:
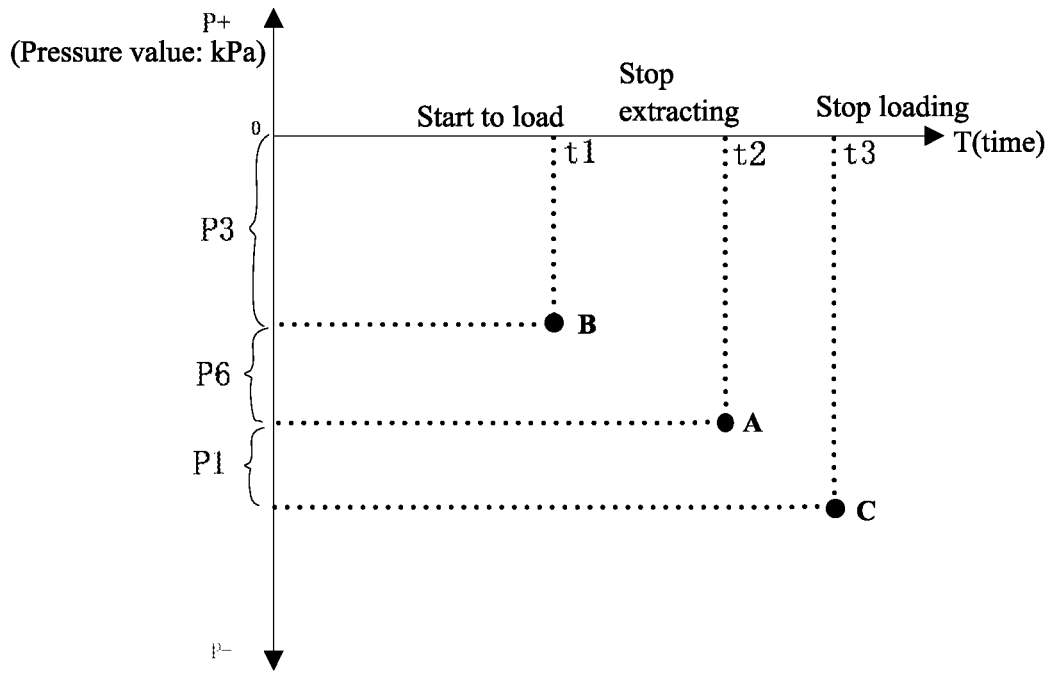
FIG. 12 is a diagram illustrating operations of an air extraction module and a loading module changing with pressures according to yet another embodiment of the present disclosure.

For example, as shown in FIG. 12, the air extraction module 103 first extracts the air from the cavity 203, and the pressure sensor 102 senses the pressure in the cavity 203 and generates a third negative pressure value. When the third negative pressure value reaches the third preset pressure value P3, that is, at time point t1 (corresponding to the point B in the figure), the controller 104 controls the loading module 101 to start to load liquid into the cavity 203, and the pressure sensor 102 continues to sense the pressure in the cavity 203 and to generate a sixth negative pressure value. When the sixth negative pressure value reaches the sixth preset pressure value P6, that is, at time point t2 (corresponding to the point A in the figure), the controller 104 controls the air extraction module 103 to stop the air extraction, and the pressure sensor 102 continues to sense the pressure in the cavity 203 and to generate a first negative pressure value. When the first negative pressure value reaches the first preset pressure value P1, that is, at time point t3 (corresponding to the point C in the figure), the controller 104 controls the loading module 101 to stop the liquid loading. The operations of the air extraction module 103 and the loading module 101 are controlled in this embodiment based only on the pressure value detected by the pressure sensor 102. The control process is very simple. The loading amount will not be too small or too large due to the tolerance in the cavity 203. In the embodiment, the third preset pressure value is in a range from minus 68 kPa to minus 80 kPa. The sixth preset pressure value is in a range from minus 81 kPa to minus 83 kPa. The first preset pressure value is in a range from minus 84 kPa and minus 98 kPa.

Figure 13:
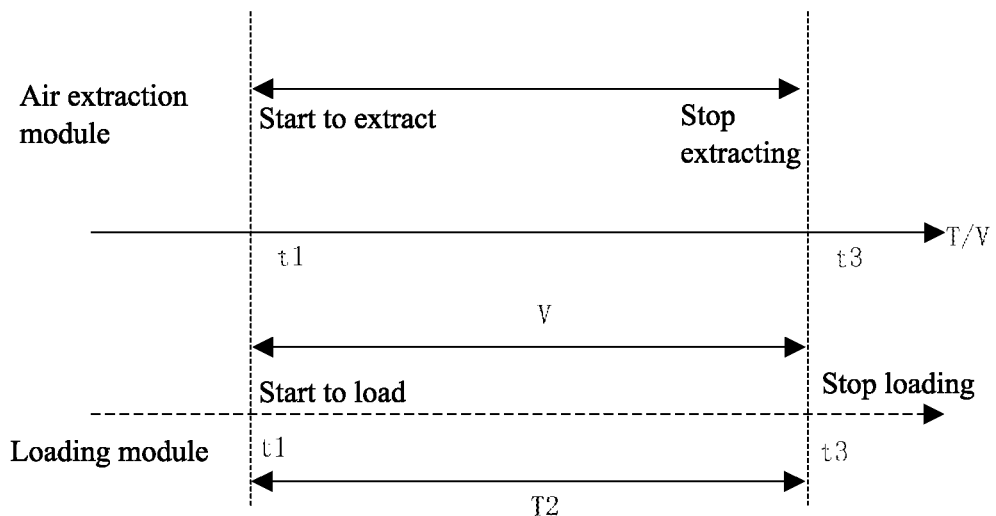
FIG. 13 is a diagram illustrating operations of an air extraction module and a loading module changing over time/with loading mounts according to yet another embodiment of the present disclosure.

In another embodiment, the controller 104 may also control the operations of the air extraction module 103 based on the loading duration or the loading amount measured by the flow sensor 111. As shown in FIG. 13, at time point t1, the controller 104 controls the loading module 101 to start to load liquid into the cavity 203. The time point reaches t3 after the loading duration T2. When the loading duration T2 reaches the preset loading time, the air extraction module 103 is controlled to stop the air extraction. When the air extraction module 103 starts, the air extraction can be set according to the actual needs. For example, in the embodiment, the controller 104 controls the air extraction module 103 to start the air extraction at time point t1. In other embodiments, the time point when the controller 104 controls the air extraction module 103 to start the air extraction can also be later or earlier than the time point t1, but the extracting duration and the time point for the air extraction module 103 to start the air extraction are no longer recorded or are not limited. It is understandable that the controller 104 can also control the operations of the air extraction module 103 when the loading amount reaches a preset loading amount. For example, when the controller 104 controls the loading module 101 to start to load liquid into the cavity 203, the flow sensor 111 senses the loading amount V of the liquid flowing into the cavity 203. When the sensed loading amount V reaches the preset loading amount V0, the air extraction module 103 is controlled to stop the air extraction. In the embodiment, the operations of the air extraction module 103 is controlled by the loading duration or the loading amount, and the control process is achieved without the pressure sensor 102. Thus, the operations are relatively simple.

In another embodiment, the controller 104 controls the air extraction module 103 to extract air from the cavity 203, and controls the pressure sensor 102 to sense the pressure in the cavity 203 and generate a third negative pressure value. When the third negative pressure value from the pressure sensor 102 reaches the third preset pressure value, the loading module 101 is controlled to start to load liquid into the cavity 203, and at this time the time point t2 can be recorded. During the liquid loading process, the pressure sensor 102 senses the pressure in the cavity 203, generates a first negative pressure value in the form of an electrical signal or a digital signal, and transmits it to the controller 104. The controller 104 receives the first negative pressure value and records the time point t4 at the same time. Thus, the duration of the loading module 101 loading liquid, that is, the first loading duration Δt from time point t2 to time point t4, can be obtained and recorded. When the first negative pressure value is always less than and does not reach the first preset pressure value, and the first loading duration Δt reaches the preset loading duration, the loading module 101 is controlled to stop loading liquid into the cavity 203. In this case, an air leak may happen to the product 200 due to poor airtightness of the product 200, which causes the pressure value difficult to drop. It should be noted that when the first negative pressure value does not reach the first preset pressure value, for example, when the cavity 203 has a fourth negative pressure value greater than the first negative pressure value (the absolute value of the negative value is large) and the total loading amount reaches the preset loading amount, the controller 104 may also control the loading module 101 to stop loading liquid into the cavity 203. That is, the controller 104 controls the loading module 101 to start to load liquid into the cavity 203 based on the third negative pressure value from the pressure sensor 102, and can at the same time record the total loading amount of the loading module 101. When the first negative pressure value is always less than and does not reach the first preset pressure value, and the total loading amount reaches the preset amount threshold, the controller 104 controls the loading module 101 to stop loading liquid into the cavity 203.

When the pressure in the cavity 203 does not reach the first preset pressure value, but the loading duration or the total loading amount of the loading module 101 exceeds the preset loading duration or the preset loading amount, the cavity 203 of the product 200 may have a leak. By monitoring the loading duration or the total loading amount, reduced processing efficiency of the loading device 100 and liquid waste caused by defects of the product 200 can be avoided. For example, a duration threshold for allowing the liquid to be loaded can be preset in the memory 105. For example, the duration threshold is 20 seconds, which means that the duration for the loading module 101 to load liquid each time cannot exceed 20 seconds. The first preset pressure value of the first negative pressure value can also be preset in the memory 105. For example, in another embodiment, when the liquid infills the cavity 203, the pressure sensor 102 senses that the pressure value in the cavity 203 may suddenly change to about minus 85 kPa (the first preset pressure value). That is, when the sensed pressure value in the cavity 203 is always greater than minus 85 kPa, but the loading duration reaches 20s, the high probability is that the product 200 has a leak, which keeps the pressure value above 85 kPa. Therefore, another data, namely the preset loading duration, is needed to assist in controlling the loading module 101 to stop the liquid loading, thereby avoiding an overflow of the liquid due to an excessive loading of the liquid. Resource waste, which is caused by further operations of unqualified product, can also be avoided.

In another embodiment, during the duration T2 that the controller 104 controls the loading module 101 to load liquid into the cavity 203 through the liquid inlet 201, the controller 104 further simultaneously controls the air extraction module 103 to extract air from the cavity 203 through the air outlet 202 during at least a portion of the duration T2. That is, there is a portion of the duration T2 for the loading module 101 to load liquid into the cavity 203 while extraction of air by the air extraction module 103 also takes place. Or, the air extraction may be performed by the air extraction module 103 in parallel with the liquid loading during the entire duration T2. In the embodiment, since the air is continuously extracted when the liquid is loaded into the cavity 203, the liquid can be guided to the cavity 203, and the fluidity of the liquid is enhanced. Thus, accumulation or stagnation of the liquid in the special-shaped space of the cavity 203 is avoided, thereby increasing the liquid loading efficiency.

In another embodiment, the controller 104 can also control the operations of the loading module 101 according to two related data including the loading time and the pressure value. The memory 105 stores a preset loading duration and a first preset pressure value. The controller 104 uses the preset loading duration and the first preset pressure value as judging standards of the duration for the loading module 101 to continuously load liquid. Specifically, at time point t1, the controller 104 controls the loading module 101 to start to load liquid into the cavity 203. At time point t2 (a loading duration T2 is passed), the first negative pressure value in the cavity 203 is sensed. When the loading duration T2 reaches the preset loading duration and the first negative pressure value reaches the first preset pressure value, the loading module 101 is controlled to stop the liquid loading. When the preset loading duration is reached at time point t1 but the first negative pressure value does not reach the first preset pressure value, filling of the cavity 203 may be incomplete (for example, the volume of the cavity 203 is larger than the volume of a standard cavity), or an air leak may happen to the product 200. The liquid loading can be continued until the first negative pressure value reaches the first preset pressure value, and then the loading module 101 is controlled to stop the liquid loading. If the first negative pressure value still does not reach the first preset pressure value after the liquid loading continues, an air leak may exist, and the controller 104 must also control the loading module 101 to stop the liquid loading. The embodiment is applicable even when the cavity 203 has a tolerance. An insufficient filling or an air leak of the cavity 203, which is caused by using the loading duration to control the loading module 101 to stop the liquid loading when a consistency of the product 200 is low, can be avoided.

In another embodiment, the controller 104 can also control the operations of the air extraction module 103 according to two related data including the pressure value in the cavity 203 and the extracting duration. The memory 105 stores a preset extracting duration and a preset pressure value. The preset pressure value includes the first preset pressure value. The controller 104 controls the air extraction module 103 to start to extract air at time point t0. Before and after the time point t0, the loading module 101 is controlled to start to load liquid into the cavity 203. At time point t1 (an extracting duration T1 is passed), when the extracting duration T1 reaches the preset extracting duration but the first negative pressure value in the cavity 203 remains below the first preset pressure value, the cavity 203 may be incompletely filled or an air leak may happen to the product 200. Then, the controller 104 controls the air extraction module 103 to continuously extract air, and the pressure sensor 102 to continuously sense the pressure in the cavity 203. When the first negative pressure value reaches the first preset pressure value, the cavity 203 is different from the standard cavity. Then, the controller 104 controls the air extraction module 103 to stop the air extraction. When the first negative pressure value remains below the first preset pressure value, there must be an air leak in the cavity 203. Then, the controller 104 still needs to control the air extraction module 103 to stop the air extraction.

In another embodiment, the controller 104 can also control the operations of the air extraction module 103 according to three related data including the pressure value in the cavity 203, the extracting duration, and the loading amount. The memory 105 stores a preset extracting duration, a preset loading amount, and a preset pressure value. The preset pressure value includes a first preset pressure value. The controller 104 controls the air extraction module 103 to start to extract air at time point t0. Before and after the time point t0, the loading module 101 is controlled to start to load liquid into the cavity 203. At time point t1 (an extracting duration T1 is passed), when the extracting duration T1 reaches the preset extracting duration, and the flow sensor 111 senses that the loading amount into the cavity 203 has reached the preset loading amount, but the first negative pressure value in the cavity 203 is still below the first preset pressure value, the cavity 203 may be incompletely filled (for example, the cavity 203 is different from the standard cavity) or there may be an air leak in the product 200. Then, the controller 104 controls the air extraction module 103 to continuously extract air, and the pressure sensor 102 to continuously sense the pressure in the cavity 203. When the first negative pressure value reaches the first preset pressure value, the cavity 203 is different from the standard cavity, and then the controller 104 controls the air extraction module 103 to stop the air extraction. When the first negative pressure value remains below the first preset pressure value, there must be an air leak in the cavity 103, and then the controller 104 also needs to control the air extraction module 103 to stop the air extraction.

Normally, during the liquid loading process, the pressure in the cavity 203 may change, for example, the negative pressure value may continue to drop. The controller 104 can also control the loading speed of the loading module 101 based on the pressure change rate in the cavity 203. Specifically, when the third negative pressure value from the pressure sensor 102 matches the third preset pressure value, the controller 104 controls the loading module 101 to start to load liquid into the cavity 203, and the controller 104 records the current pressure value in the cavity 203 to be the third negative pressure value. During the liquid loading process, after the first loading time Δt, for example, the pressure sensor 102 senses the pressure in the cavity 203, generates a fifth negative pressure value (less than the third negative pressure value) in the form of an electrical signal or a digital signal, and sends it to the controller 104. The controller 104 obtains the pressure change rate in the cavity 203 according to the third negative pressure value, the fifth negative pressure value, and the first loading duration Δt, and further determines whether to adjust the loading speed of the loading module 101 according to the pressure change rate. For example, the formula for calculating the pressure change rate in the embodiment may be as follows:

Pressure change rate=(the fifth negative pressure value−the third negative pressure value)/(Δ$t$)

Based on the above formula, if the pressure change rate is higher than a preset threshold, the loading speed may be too fast, which may cause difficulty in extracting the air from the cavity 203 or from the liquid. Then, the controller 104 can control the loading module 101 to decrease the loading speed. It is understandable that the controller 104 can record multiple pressure values from the pressure sensor 102 according to actual needs, and then calculate the pressure change rate.

In another embodiment, the memory 105 may also store the threshold of the extracting duration. The extracting duration includes a first extracting duration and a second extracting duration. The controller 104 first controls the air extraction module 103 to extract air from the cavity 203, and records the first extracting duration. When the first extracting duration reaches a first preset extracting duration, the controller 104 controls the loading module 101 to start to load liquid. After the second extracting duration is passed, when the second extracting duration reaches a second preset extracting duration, the controller 104 controls the air extraction module 103 to stop extracting air from the cavity 203. When to stop the liquid loading can be judged according to the loading duration, the pressure value, or the loading amount.

In another embodiment, after the controller 104 controls the loading module 101 to stop loading liquid into the cavity 203, since the state of the loaded liquid is not completely stable, the controller 104 further controls the loading module 101 and the air extraction module 103 to maintain contact with the liquid inlet 201 and the air outlet 202, respectively, so as to maintain the pressure in the cavity 203 for a certain duration. Thus, an uneven distribution of the liquid in the cavity 203, which is caused by a sudden change of the pressure value in the cavity 203, can be avoided. In the embodiment, the duration for maintaining the pressure may be 1 second to 5 seconds.

After maintaining the pressure, depending on the type of the product 200 or the type of the loaded liquid, the product 200 can be cured according to actual needs.

It should be noted that the preset loading duration, the preset loading amount, the sixth preset pressure value, the second preset pressure value, and third preset pressure value can be obtained based on an average value of recorded values during multiple historical liquid loadings and multiple historical air extractions. It should be noted that each of the sixth negative pressure value, the second negative pressure value, the third negative pressure value, the sixth preset pressure value, the second preset pressure value, and the third preset pressure value may be negative pressure values.

Figure 23:
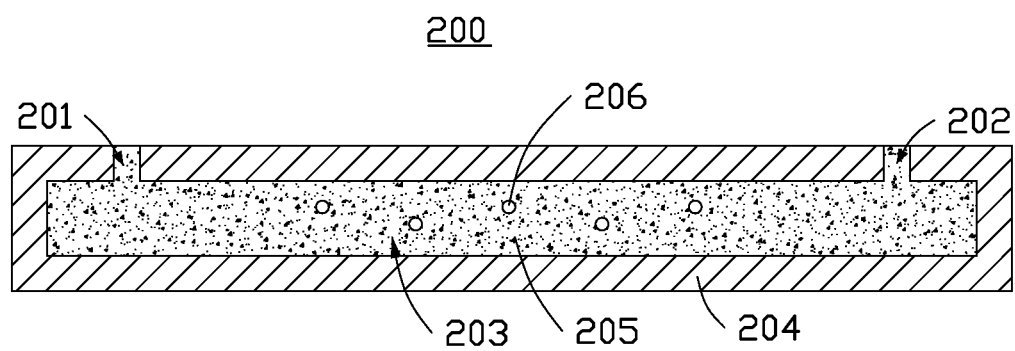
FIG. 23 is a diagrammatic view of a product according to the present disclosure.

The product 200 may be an electronic product, including but not limited to, a smart phone, a tablet computer, a desktop computer, a notebook computer, a watch, a bracelet, a headset, a speaker, and the like. Referring to FIG. 23, the product 200 includes a housing 204 of the electronic product, and the cavity 203 is a cavity formed by the housing. The housing 204 can be made of a material selected from a group consisting of stainless steel, aluminum, magnesium, aluminum-magnesium alloy, titanium-based alloy, ceramic, and plastic, and any combination thereof. The liquid loaded into the product 200 includes, but is not limited to, liquid water, fluid solution, curable glue, suspended glue, and the like. The type, the composition, and the viscosity of the liquid is not limited in the embodiment.

In the embodiment, the product 200 is a mobile phone, including a housing 204 and an electronic display (not shown in the figures) arranged on the housing 204. The housing 204 is made of stainless steel and plastic, and the stainless steel and the plastic are bonded to each other to form the cavity 203. Electronic components connected to the electronic display are also disposed in the cavity 203. The liquid loaded into the cavity 203 of the product 200 is a curable glue or a suspended glue. The liquid can include a single component or multiple components, for example, a mixture of multiple components to improve curing effect. The component of the liquid includes liquid epoxy resin. The viscosity of the liquid is in a range between 8000 centipoises (CP) and 10000 centipoises (CP).

In the embodiment, after maintaining the pressure, the liquid loaded into the cavity 203 of the product 200 is not completely cured. Therefore, the product 200 needs to be cured to shape the liquid in the cavity 203. Thus, the impact resistance strength of the product 200 is improved.

Since liquid is loaded to fill the cavity 203 and the filling saturation is high, the peeling force and the impact resistance performance of the overall structure of the housing 204 including the electronic components are thus enhanced.

In the embodiment, the liquid loading device 100 controls the loading module 101 to start to load or stop loading the liquid based on the loading duration, the loading amount, or the pressure in the cavity 203 sensed by the pressure sensor 102. The liquid loading device 100 also controls the air extraction module 103 to start to extract or stop extracting air based on the extraction duration, the loading duration, the loading amount, or the pressure. Thus, an automatic control of the liquid loading during the entire operation process can be realized, and gaps during the liquid loading can be avoided. Since the air extraction has a guiding effect on the flow direction of the liquid, finally, the liquid is evenly distributed in the cavity 203. Inconsistent filling inside the product caused by the tolerance of the cavity 203 is avoided. The impact resistance of the entire product is thus improved.

Furthermore, since the elastic member is disposed on the liquid inlet 201 that can cooperate with the loading needle 11, external air is prevented from entering the cavity 203 of the product 200. The liquid in the cavity 203 is also prevented from overflowing from the liquid inlet 201.

Furthermore, since the breathable member is disposed on the air outlet 202 that can cooperate with the air extraction module 103, the liquid in the cavity 203 is prevented from overflowing from the air outlet 202 when the air extraction module 103 extracts air.

The embodiment of the present disclosure also provides a liquid loading method for loading liquid into the product. The liquid loading method can be implemented in the liquid loading device 100. The liquid loaded into the product can increase the internal bonding within the product, thereby improving the impact resistance of the product. The following description is for illustrating the liquid loading method, which can also refer to the liquid loading device 100 described above for simplicity.

Figure 14:
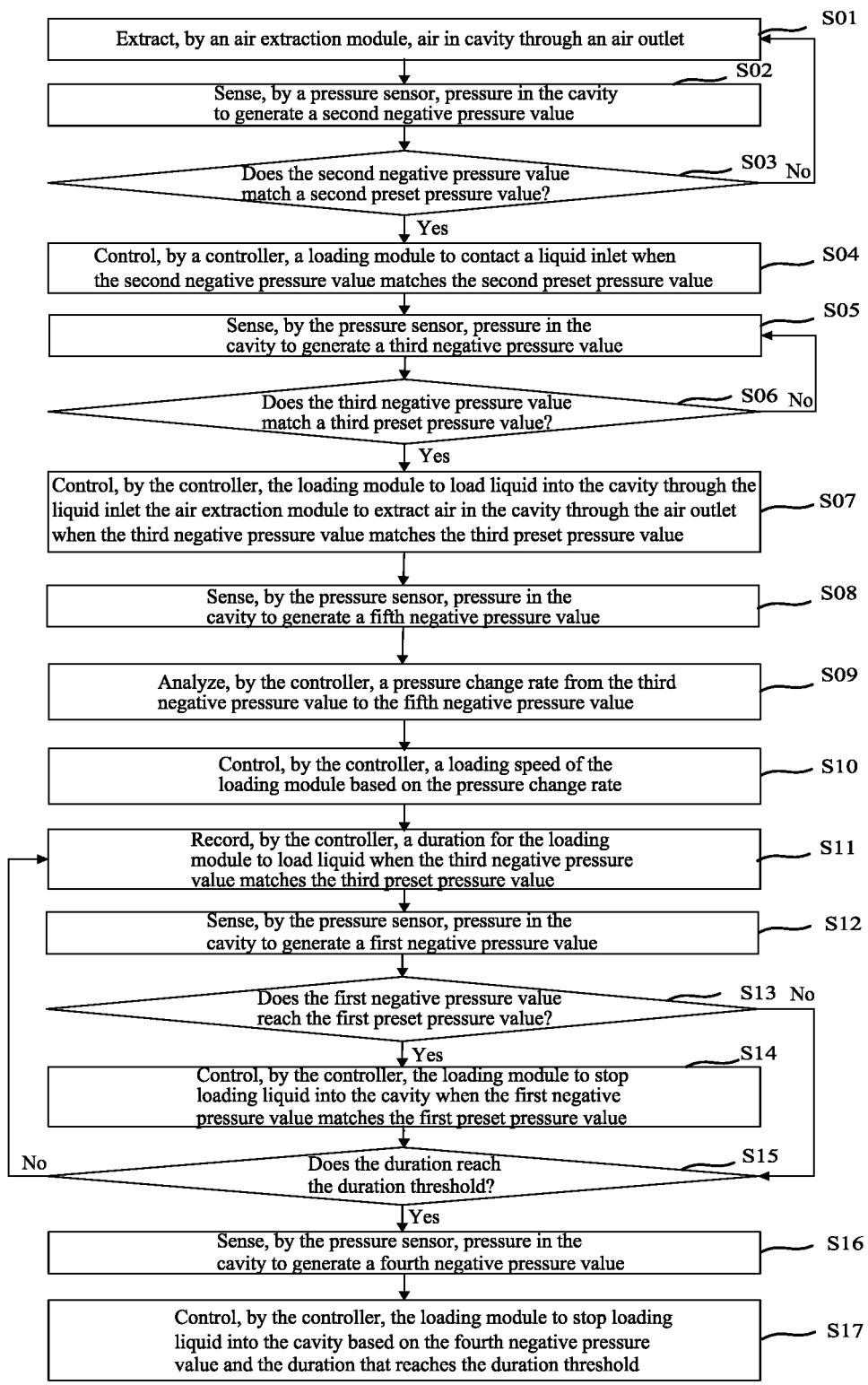
FIG. 14 is a flowchart of a liquid loading method according to an embodiment of the present disclosure.

As shown in FIG. 14, a flowchart of a liquid loading method provided by the embodiment is illustrated. The liquid loading method includes following steps.

Step S01: the air extraction module extract air from the cavity through the air outlet.

After the air is extracted by the air extraction module, a certain negative pressure environment relative to the outside of the cavity can be formed due to the reduction of air in the cavity.

Step S02: the pressure sensor senses the pressure in the cavity to generate a second negative pressure value.

The pressure sensor senses the pressure in the cavity, generates the second negative pressure value in the form of an electrical signal or a digital signal, and transmits the second negative pressure value to the controller through the communication bus. The controller receives the second negative pressure value from the pressure sensor through the communication bus.

Step S03: whether the second negative pressure value matches the second preset pressure value is determined, if yes, the procedure goes to step S04; otherwise, step S01 is if not, back to Step S01.

The second preset pressure value is prestored in the memory. The controller receives the second negative pressure value from the pressure sensor and calls the second preset pressure value in the memory, to determine whether the second negative pressure value matches the second preset pressure value. In the embodiment, the second negative pressure value may be between minus 68 kPa and minus 80 kPa.

In other embodiments, step S04 may be performed when the second negative pressure value does not reach the second preset pressure value.

Step S04: when the second negative pressure value matches the second preset pressure value, the controller controls the loading module to contact the liquid inlet. When the second negative pressure value matches the second preset pressure value, the controller controls the loading module to move toward the liquid inlet and contact the liquid inlet. When the loading module contacts the liquid inlet, since a little amount of air exists in the loading needle and pressure value in the cavity is the second negative pressure value, the liquid loading by the loading needle causes the pressure in the cavity to increase. In the embodiment, after the loading needle contacts the liquid inlet, the controller does not control the load module to immediately load liquid, but instead controls the air extraction module to continuously extract air from the cavity.

Step S05: The pressure sensor continuously senses the pressure in the cavity, generates the third negative pressure value in the form of an electrical signal or a digital signal, and transmits it to the controller.

Step S06: whether the third negative pressure value matches the third preset pressure value is determined, if yes, the procedure goes to step S07; otherwise, back to Step S05.

The third preset pressure value is prestored in the memory. The controller receives the third negative pressure value from the pressure sensor and calls the third preset pressure value in the memory. The controller determines whether the third negative pressure value matches the third preset pressure values. Since the air extraction module continuously extracts air, the pressure value in the loading needle is finally consistent with the pressure value in the cavity, and the third negative pressure value is smaller than the second negative pressure value. The third negative pressure value is between negative 81 and negative 83 kPa.

Step S07: when the third negative pressure value matches the third preset pressure value, the controller controls the loading module to load liquid into the cavity through the liquid inlet, and controls the air extraction module to extract air from the cavity through the air outlet.

In the embodiment, the controller receives the third negative pressure value from the pressure sensor through the communication bus. When the third negative pressure value matches the third preset pressure value, the controller controls the loading module to load liquid into the cavity through the liquid inlet, and at the same time controls the air extraction module to continuously extract air from the cavity through the air extraction nozzle.

At this step, after reaching the third negative pressure value, the controller controls the loading module to start to load liquid into the cavity. Due to a certain viscosity of the liquid, air is extracted through the air outlet while the liquid is loaded, which allows the liquid to be evenly distributed in the cavity.

In another embodiment, at some steps from step S01 to step S07, the controller may control the loading module to contact the liquid inlet according to a first duration. The first duration is the duration for the extraction module to continuously extract air from the cavity. The loading module is controlled to load liquid into the cavity according to the second duration. The second duration is the duration for the extraction module to extract air again after the loading module contacts the liquid inlet (that is, after the first duration).

Step S08: the pressure sensor senses the pressure in the cavity to generate a fifth negative pressure value.

As the liquid is loaded and the air extraction module continuously extracts air, the space in the cavity becomes smaller, and the fifth negative pressure value is smaller than the third negative pressure value.

Step S09: the controller analyzes the pressure change rate from the third negative pressure value to the fifth negative pressure value.

Normally, during the liquid loading process, the pressure in the cavity may change, for example, the negative pressure value may continue to drop. The controller can also control the loading speed of the loading module based on the pressure change rate in the cavity. Specifically, when the third negative pressure value from the pressure sensor matches the third preset pressure value, the controller controls the loading module to start to load liquid into the cavity, and the controller records the current pressure value in the cavity to be the third negative pressure value. During the liquid loading process, after the loading time Δt for example, the pressure sensor senses the pressure in the cavity, generates a fifth negative pressure value in the form of an electrical signal or a digital signal, and sends it to the controller. The fifth negative pressure value is any pressure value less than the third negative pressure value. The controller obtains the pressure change rate in the cavity according to the third negative pressure value, the fifth negative pressure value, and the loading duration Δt. For example, the formula for calculating the pressure change rate in the embodiment may be as follows:

Pressure change rate=(the fifth negative pressure value−the third negative pressure value)/(Δt)

Step S10: the controller controls the loading speed of the loading module for loading liquid into the cavity based on the pressure change rate.

The controller further determines whether to adjust the loading speed of the loading module according to the pressure change rate. For example, if the pressure change rate is higher than a preset threshold, the loading speed may be too fast, which hinders the extraction of the air in the cavity or in the liquid. At this time, the controller can control the loading module to slow down the loading speed. It is understandable that the controller can record multiple pressure values from the pressure sensor according to actual needs, and then calculate the loading speed accordingly.

In the embodiment, the loading speed of the liquid is controlled based on the change rate of the negative pressure value, which can cause the final loading speed of the liquid to be stable, thereby preventing the loading speed of the liquid from being too fast due to the rapid change of the negative pressure value, and preventing the loading speed of the liquid from being too slow due to the slow change of the negative pressure value.

In some embodiments, step S08 to step S10 can be omitted.

Step S11: when the third negative pressure value matches the third preset pressure value, the controller records the duration for the loading module to load liquid. From step S06, the moment when the pressure in the cavity reaches the third negative pressure value is the moment when the controller is triggered to control the loading module to start to load liquid into the cavity. At this time, the controller or the loading module records the duration for the loading module to load liquid, for preparation for following steps.

In some embodiments, step S07 to step S11 may be simultaneously executed.

Step S12: the pressure sensor senses the pressure in the cavity to generate a first negative pressure value.

While the liquid is loaded by the loading module, the pressure sensor continuously senses the pressure in the cavity, generates a first negative pressure value in the form of an electrical signal or a digital signal, and sends the first negative pressure value to the controller.

Step S13: whether the first negative pressure value reaches the first preset pressure value is determined, if yes, the procedure goes to step S14; otherwise, the procedure goes to step S15.

The first negative pressure value is between minus 84 and minus 98 kPa. Optionally, the first negative pressure value is minus 85 kPa.

Step S14: when the first negative pressure value matches the first preset pressure value, the controller controls the loading module to stop loading liquid into the cavity.

The first preset pressure value is prestored in the memory. The controller receives the first negative pressure value from the pressure sensor through the communication bus, and calls the first preset pressure value in the memory to determine whether the first negative pressure value matches the first negative preset value. When the first negative pressure value matches the first preset pressure value, the loading module is controlled to stop loading liquid into the cavity, and the air extraction module is controlled to stop extracting air.

After the controller controls the loading module to stop loading liquid into the cavity, since the loaded liquid is not completely stable, the controller also controls the loading module and the air extraction module to respectively maintain contact with the liquid inlet and air outlets, so as to maintain the pressure in the cavity for a certain duration. In one embodiment, the duration for maintaining the pressure may be 1 second to 5 seconds. Thus, an uneven distribution of the liquid in the cavity, which is caused by the sudden change of the pressure value in the cavity, can be avoided.

Step S15: whether the duration reaches the duration threshold is determined, if yes, the procedure goes to step S16; otherwise, step S11 is repeated.

The duration threshold is prestored in the memory, and the controller determines whether the loading duration of loading liquid into the cavity reaches the duration threshold.

Step S16: the pressure sensor senses the pressure in the cavity to generate a fourth negative pressure value.

When the loading module loads liquid, the pressure sensor continuously senses the pressure in the cavity, generates a fourth negative pressure value in the form of an electrical signal or a digital signal, and sends the fourth negative pressure value to the controller. The fourth negative pressure value is greater than the first negative pressure value.

Step S17: based on the fourth negative pressure value and the duration that reaches the duration threshold, the controller controls the loading module to stop loading liquid into the cavity.

In the embodiment, the controller controls the loading module to start to load liquid into the cavity based on the third negative pressure value from the pressure sensor, and records the time point t2 at this time. During the liquid loading process, the pressure sensor senses the pressure in the cavity, generates a fourth negative pressure value in the form of an electrical signal or digital signal, and transmits it to the controller. The controller receives the fourth negative pressure value and records the time point t4, thereby obtaining and recording the loading duration for the loading module to load liquid, that is, the duration Δt is from time point t2 to time point t4. When Δt reaches or exceeds the preset duration threshold and the fourth negative pressure value is greater than the first negative pressure value, the loading module is controlled to stop loading liquid into the cavity.

When the pressure sensor senses the pressure value in the cavity, the pressure value may never reach the first negative pressure value. In this case, when to stop loading liquid cannot be only judged by the pressure value in the cavity. The embodiment judges when to stop loading liquid into the cavity by the loading duration for loading liquid into the cavity. Thus, the liquid loading device continuously loading liquid into the cavity when the pressure value does not reach the first negative pressure value, which may cause overload operation of the liquid loading device and even safety problems, can be avoided. In the embodiment, by monitoring the loading duration, reduced processing efficiency of the liquid loading device and liquid waste caused by defects of the product can also be avoided.

In one embodiment, the liquid loading method further includes curing the product. The curing temperature is between 30° C. and 60° C., and the curing time is between 20 minutes and 50 minutes.

Figure 15:
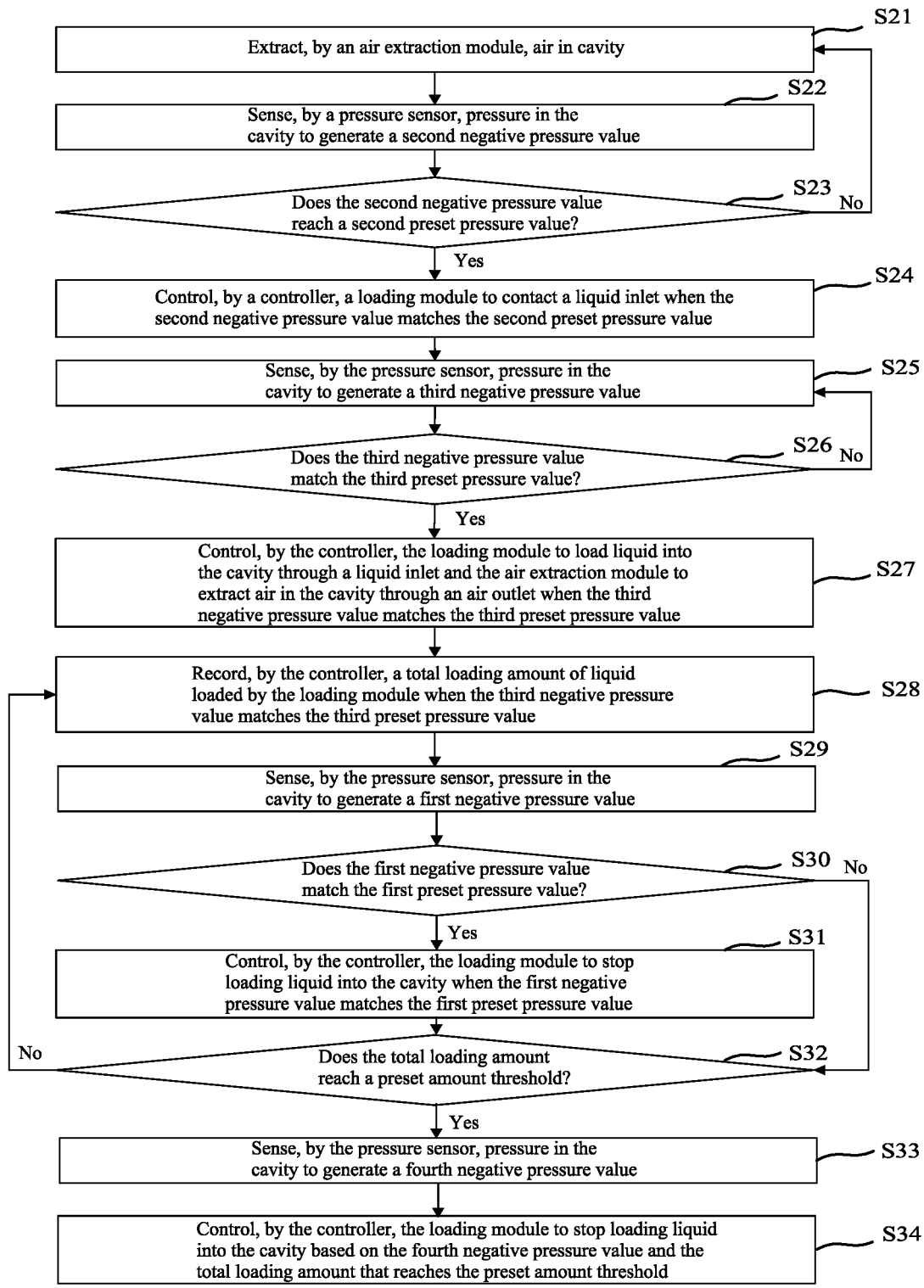
FIG. 15 is a flowchart of a liquid loading method according to another embodiment of the present disclosure.

Another embodiment of the present disclosure also provides a liquid loading method for loading liquid into the product. The liquid loading method can be implemented in the liquid loading device 100. FIG. 15 is a flowchart of another embodiment of a liquid loading method. The liquid loading method includes following steps.

Step S21: the air extraction module extracts air from the cavity.

Step S22: the pressure sensor senses the pressure in the cavity to generate a second negative pressure value.

Step S23: whether the second negative pressure value reaches the second preset pressure value is determined, if yes, the procedure goes to step S24; otherwise, step S21 is repeated.

Step S24: when the second negative pressure value matches the second preset pressure value, the controller controls the loading module to contact the liquid inlet.

Step S25: the pressure sensor senses the pressure in the cavity to generate a third negative pressure value.

Step S26: whether the third negative pressure value matches the third preset pressure value is determined, if yes, the procedure goes to step S27; otherwise, step S25 is repeated.

Step S27: when the third negative pressure value matches the third preset pressure value, the controller controls the loading module to load liquid into the cavity through the liquid inlet, and control the air extraction module to extract air from the cavity through the air outlet.

Step S28: when the third negative pressure value matches the third preset pressure value, the controller records the total loading amount of liquid loaded by the loading module.

Step S29: the pressure sensor senses the pressure in the cavity to generate a first negative pressure value.

Step S30: whether the first negative pressure value matches the first preset pressure value is determined, if yes, the procedure goes to step S31, otherwise, the procedure goes to step S32.

Step S31: when the first negative pressure value matches the first preset pressure value, the controller controls the loading module to stop loading liquid into the cavity.

Step S32: whether the total loading amount reaches the preset amount threshold is determined, if yes, the procedure goes to step S33; otherwise, step S28 is repeated.

Step S33: the pressure sensor senses the pressure in the cavity to generate a fourth negative pressure value.

Step S34: based on the fourth negative pressure value and the total loading amount that reaches the preset amount threshold, the controller controls the loading module to stop loading liquid into the cavity.

When the total loading amount reaches the preset amount threshold, the pressure value generated by the pressure sensor is the fourth negative pressure value, and the fourth negative pressure value is greater than the first negative pressure value. When the pressure sensor senses the pressure value in the cavity, the pressure value may never reach the first negative pressure value. Then, the cavity of the product may have a leak. At this time, when to stop loading liquid into the cavity cannot be only judged by the pressure value in the cavity. In the embodiment, the total loading amount of the liquid into the cavity is used to determine when to stop loading liquid. Thus, the liquid loading device continuously loading liquid into the cavity when the pressure value does not reach the first negative pressure value, which may cause overload operation of the liquid loading device and even safety problems, can be avoided.

By monitoring the total loading amount of the liquid in the liquid loading method of the embodiment, reduced processing efficiency of the liquid loading device and liquid waste caused by defects of the product can also be avoided.

Figure 16:
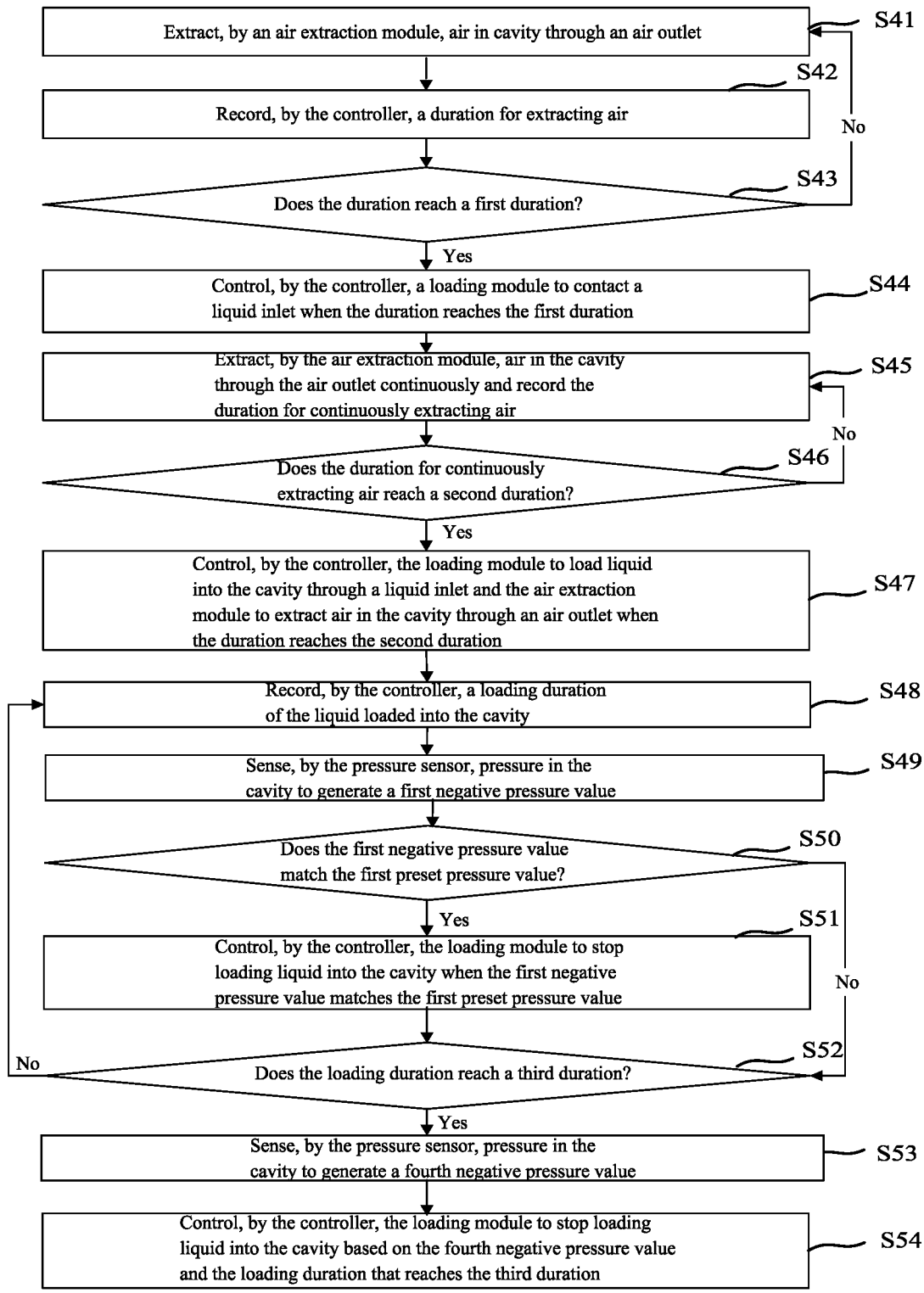
FIG. 16 is a flowchart of a liquid loading method according to yet another embodiment of the present disclosure.

Another embodiment of the present disclosure also provides a liquid loading method for loading liquid into the product. The liquid loading method can be implemented in the liquid loading device 100. FIG. 16 is a flowchart of another embodiment of a liquid loading method. The liquid loading method includes following steps.

Step S41: the air extraction module extracts air from the cavity through the air outlet.

Step S42: the controller records the duration for extracting air.

The duration is a length of time for the air extraction module to continuously extract air.

Step S43: whether the duration reaches the first duration is determined, if yes, the procedure goes to step S44; otherwise, step S41 is repeated.

Step S44: when the duration reaches the first duration, the controller controls the loading module to contact the liquid inlet. The first duration is the duration for extracting air, for example, 2 seconds.

The first duration and the second duration are stored in the memory. The first duration is the duration for the controller to control the air extraction module to extract air. The second duration is the duration for the controller to control the extraction module to extract air again after the loading module contacts the liquid inlet and starts to load liquid.

Step S45: the air extraction module continuously extracts air from the cavity through the air outlet, and records the duration for continuously extracting air.

The duration for continuously extracting air is the duration for continuing extracting air after the first duration.

Step S46: whether the duration for continuously extracting air reaches the second duration is determined, if yes, the procedure goes to step S47; otherwise, step S45 is repeated. The second duration is the duration for continuously extracting air after the loading module contacts the liquid inlet, for example, 1 second.

Step S47: when the duration for continuously extracting air reaches the second duration, the controller controls the loading module to load liquid into the cavity through the liquid inlet, and controls the air extraction module to extract air from the cavity through the air outlet.

Step S48: the controller records the loading duration of loading liquid into the cavity.

Step S49: the pressure sensor senses the pressure in the cavity to generate a first negative pressure value.

Step S50: whether the first negative pressure value matches the first preset pressure value is determined, if yes, the procedure goes to step S51; otherwise, the procedure goes to step S52.

Step S51: when the first negative pressure value matches the first preset pressure value, the controller controls the loading module to stop loading liquid into the cavity.

Step S52: whether the loading duration reaches the third duration is determined, if yes, the procedure goes to step S53; otherwise, step S48 is repeated.

Step S53: the pressure sensor senses the pressure in the cavity to generate a fourth negative pressure value.

Step S54: based on the fourth negative pressure value and the loading duration that reaches the third duration, the controller controls the loading module to stop loading liquid into the cavity. The fourth negative pressure value is greater than the first negative pressure value.

In the loading method of the embodiment, the extracting duration is used to determine when to control the loading module to contact the liquid inlet (the duration for continuously extracting air, that is, the first duration). The extracting duration is also used to determine when to start to load liquid into the cavity (the duration for continuously extracting air after the first duration, that is, the second duration). Finally, whether to stop loading liquid into the cavity is determined by the pressure value in the cavity. Thus, the problem of insufficient filling in the cavity caused by an inconsistency of the cavity can be avoided.

In another embodiment, steps S49 to S51 can also be omitted, and when to control the loading module to stop loading liquid into the cavity is only judged by whether the loading duration reaches the third duration. That is, during the entire working process, the loading module contacting the liquid inlet, the start of liquid loading into the cavity, and the stop of liquid loading are all triggered by the duration, which can realize automatic control of the entire liquid loading process.

In another embodiment, step S48 may also be the controller recording the total loading amount of the liquid loaded into the cavity. Step S52 may be the controller controlling the loading module to stop loading liquid into the cavity based on the fourth negative pressure value and the total loading amount that reaches the total loading threshold. That is, the stop of the liquid loading into the cavity is triggered by whether the total loading amount reaches the threshold, which can realize automatic control of the entire liquid loading process.

Figure 17:
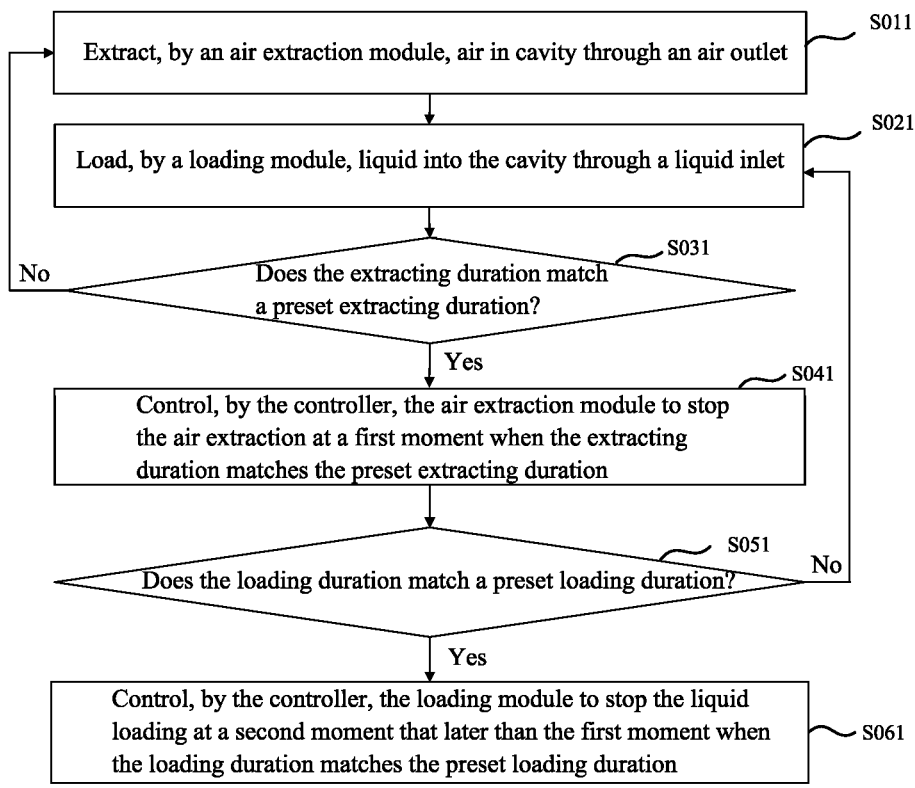
FIG. 17 a flowchart of a liquid loading method according to yet another embodiment of the present disclosure.

FIG. 17 is a flowchart of a liquid loading method according to an embodiment.

In the embodiment, the memory stores the preset extracting duration, which is the judging standard for the duration of the air extraction. The memory also stores the preset loading duration, which is the judging standard for the duration of the liquid loading. The liquid loading method includes following steps.

Step S011: the air extraction module extract air from the cavity through the air outlet.

The controller controls the air extraction module to start the air extraction. After the air extraction module extracts air, a certain negative pressure environment relative to the outside of the cavity is formed due to the reduction of air in the cavity. At this step, the controller also records the extracting duration of the air extraction module.

Step S021: the loading module loads liquid into the cavity through the liquid inlet.

The controller controls the loading module to start to load liquid into the cavity. The controller also controls the liquid loading to stop when a certain data matches requirements, and the controller controls the loading module to continuously load liquid before stopping the liquid loading. In the embodiment, the time point when the loading module starts the liquid loading is later than the time point when the air extraction module starts the air extraction. In other embodiments, step S021 can be performed synchronously with step S011, and can also be performed between steps S031-S041 or after step S041.

Step S031: whether the extracting duration matches the preset extracting duration is determined. If yes, the procedure goes to step S041; otherwise, step S011 is repeated.

The controller records the extracting duration of the air extraction module, and compares the extracting duration with the preset extracting duration.

Step S041: when the extracting duration matches the preset extracting duration, the controller controls the air extraction module to stop the air extraction at the first moment.

Step S051: whether the loading duration matches the preset loading duration is determined.

The controller records the loading duration of the loading module, and compares the loading duration with the preset loading duration.

Step S061: when the loading duration matches the preset loading duration, the controller controls the loading module to stop the liquid loading at the second moment, where the second moment is later than the first moment.

In other embodiments, the second moment may be the same as or earlier than the first moment.

In the embodiment, the controller controls the air extraction module to stop the air extraction through the extracting duration, and controls the loading module to stop the liquid loading through the loading duration. Also, the moment when the loading module stops the liquid loading is later than the moment when the air extraction module stops the air extraction. Thus, when the cavity is about to be completely infilled, the liquid is prevented from being drawn into the air extraction nozzle to block the air extraction nozzle due to the air extraction of the air extraction module. In the embodiment, the breathable member is omitted from the air outlet. In other embodiments, the breathable member is set to cover the air outlet. The embodiment can also realize the automatic control of the air extraction module and the loading module.

Figure 18:
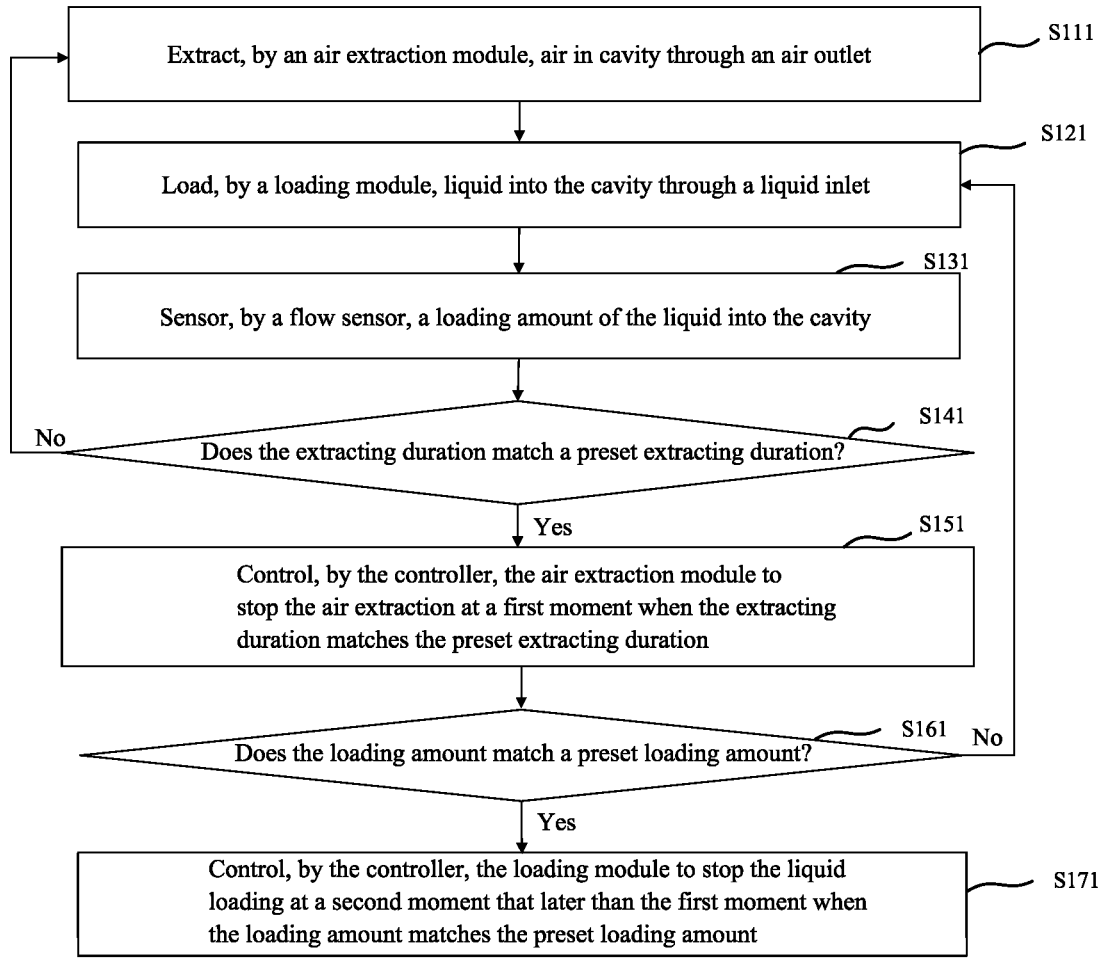
FIG. 18 is a flowchart of a liquid loading method according to yet another embodiment of the present disclosure.

FIG. 18 is a flowchart of a liquid loading method according to another embodiment. In the embodiment, the memory stores the preset extracting duration, which is the judging standard for the duration of the air extraction. The memory also stores the preset loading duration, which is the judging standard for the duration of the liquid loading. The liquid loading method includes following steps.

Step S111: the air extraction module extract air from the cavity through the air outlet.

At this step, the controller controls the air extraction module to start the air extraction, and also records the extracting duration of the air extraction module.

Step S121: the loading module loads liquid into the cavity through the liquid inlet.

The controller controls the loading module to start to load liquid into the cavity. The controller also controls the liquid loading to stop when a certain data matches requirement, and the controller controls the loading module to continuously load liquid before stopping the liquid loading. In the embodiment, the time point when the loading module starts the liquid loading is later than the time point when the air extraction module starts the air extraction. In other embodiments, step S121 can be performed synchronously with step S111, and can also be performed between steps S131-S141 or after step S141.

Step S131: the flow sensor senses the loading amount of the liquid into the cavity.

The loading amount sensed by the flow sensor is fed back to the controller, and the controller performs subsequent control actions based on the loading amount.

Step S141: whether the extracting duration matches the preset extracting duration is determined. If yes, the procedure goes to step S151; otherwise, step S111 is repeated.

The controller records the extracting duration of the air extraction module, and compares the extracting duration with the preset extracting duration.

Step S151: when the extracting duration matches the preset extracting duration, the controller controls the air extraction module to stop the air extraction at the first moment.

Step S161: whether the loading amount matches the preset loading amount is determined, if yes, the procedure goes to step S171; otherwise, step S121 is repeated.

The controller compares the loading amount with the preset loading amount.

Step S171: when the loading amount matches the preset loading amount, the controller controls the loading module to stop the liquid loading at the second moment, and the second moment is later than the first moment. In other embodiments, the second moment may be the same as or earlier than the first moment.

In the embodiment, the controller controls the air extraction module to stop the air extraction through the extracting duration, and controls the loading module to stop the liquid loading through the loading duration. Also, the moment when the loading module stops the liquid loading is later than the moment when the air extraction module stops the air extraction. Thus, when the cavity is about to be completely infilled, the liquid is prevented from being drawn into the air extraction nozzle to block the air extraction nozzle due to the air extraction of the air extraction module. In the embodiment, the breathable member is omitted from the air outlet. In other embodiments, the breathable member is kept.

Figure 19:
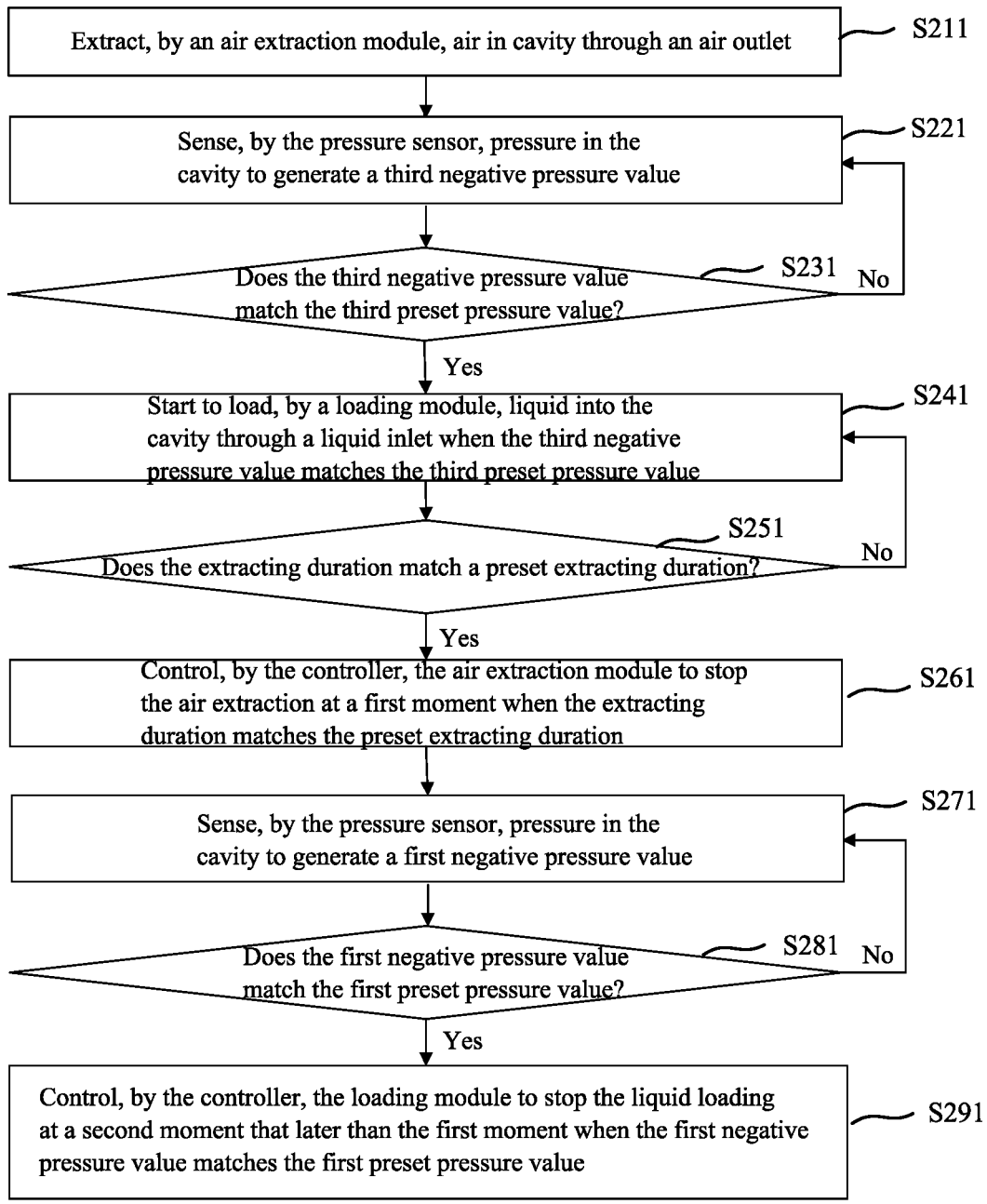
FIG. 19 is a flowchart of a liquid loading method according to yet another embodiment of the present disclosure.

FIG. 19 is a flowchart of a liquid loading method according to another embodiment. In the embodiment, the memory stores the preset extracting duration, which is the judging standard for the duration of the air extraction. The memory also stores the third preset pressure value, which is the judging standard of a certain pressure value for starting the liquid loading. The memory also stores the first preset pressure value, which is the judging standard of another pressure value for stopping the liquid loading. The liquid loading method includes following steps.

Step S211: the air extraction module extract air from the cavity through the air outlet.

At this step, the controller controls the air extraction module to start the air extraction, and also records the extracting duration of the air extraction module.

Step S221: the pressure sensor senses the pressure in the cavity to generate a third negative pressure value.

The memory stores the preset extracting duration of the air extraction module and the preset pressure value in the cavity. The preset pressure value includes the third preset pressure value and the first preset pressure value.

Step S231: whether the third negative pressure value matches the third preset pressure value is determined. If yes, the procedure goes to step S241; otherwise, step S221 is repeated.

The controller compares the third negative pressure value with the third preset pressure value.

Step S241: when the third negative pressure value matches the third preset pressure value, the loading module starts to load liquid into the cavity through the liquid inlet.

The time for the controller to control the liquid loading device to start to load liquid into the cavity can be before, after, or between steps S211-S231. That is, step S241 may be before, after, or between steps S211-S231.

Step S251: whether the extracting duration matches the preset extracting duration is determined. If yes, the procedure goes to step S261, otherwise, step S241 is repeated.

Step S261: when the extracting duration matches the preset extracting duration, the controller controls the air extraction module to stop the air extraction at the first moment.

The controller compares the extracting duration with the preset extracting duration.

Step S271: the pressure sensor senses the pressure in the cavity to generate a first negative pressure value.

Step S281: whether the first negative pressure value matches the first preset pressure value is determined.

The controller compares the first negative pressure value with the first preset pressure value.

Step S291: when the first negative pressure value matches the first preset pressure value, the controller controls the loading module to stop the liquid loading at the second moment, and the second moment is later than the first moment.

In the embodiment, the controller controls the air extraction module to stop the air extraction through the extracting duration, and controls the loading module to start to load and stop the liquid loading through the pressure value. Also, the moment when the loading module stops the liquid loading is later than the moment when the air extraction module stops the air extraction. Thus, when the cavity is about to be completely infilled, the liquid is prevented from being drawn into the air extraction nozzle to block the air extraction nozzle due to the air extraction of the air extraction module. In addition, when the pressure value is used to determine when to start to load or stop the loading liquid, compared with using the loading duration or the loading amount to determine when to stop the loading liquid, stopping the liquid loading when the cavity is insufficient infilled, which is caused by an inconsistency (tolerance) of the cavity, can be avoided. The embodiment can also realize the automatic control of the air extraction module and the loading module. In other embodiments, the second moment may also be earlier than or the same as the first moment.

Figure 20:
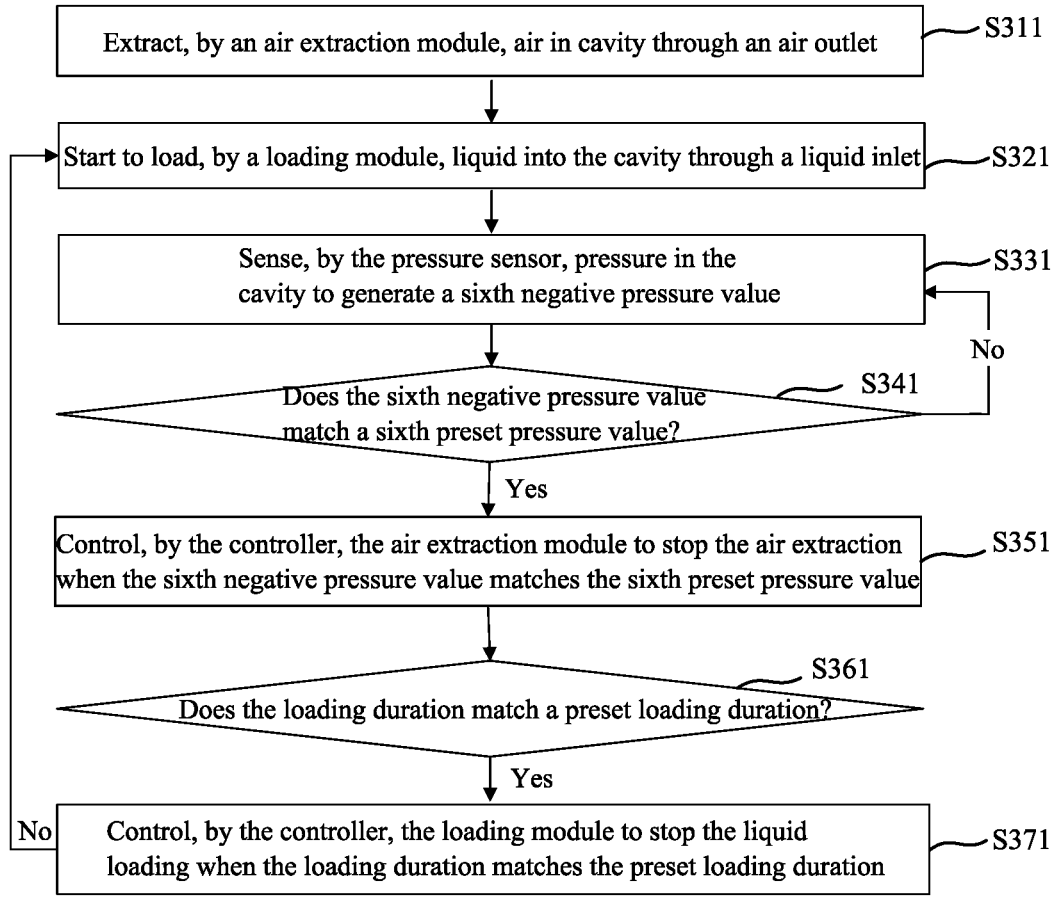
FIG. 20 is a flowchart of a liquid loading method according to yet another embodiment of the present disclosure.

FIG. 20 is a flowchart of a liquid loading method according to an embodiment. In the embodiment, the memory stores the sixth preset pressure value, which is the judging standard of a certain pressure value for stopping the air extraction. The memory also stores the preset loading duration, which is the judging standard of a certain duration for stopping the liquid loading. The liquid loading method includes following steps.

Step S311: the air extraction module extract air from the cavity through the air outlet.

The controller controls the air extraction module to start the air extraction. After the air extraction module extracts air, a certain negative pressure environment relative to the outside of the cavity is formed due to the reduction of air in the cavity.

Step S321: the loading module starts to load liquid into the cavity through the liquid inlet.

The loading duration of the loading module is recorded by the controller. Step S321 can be synchronously performed with step S311, or before or after step S311.

Step S331: the pressure sensor senses the pressure in the cavity to generate a sixth negative pressure value.

Step S341: whether the sixth negative pressure value matches the sixth preset pressure value is determined. If yes, the procedure goes to step S351; otherwise, step S331 is repeated.

When the controller controls the air extraction module to extract air and controls the loading module to load liquid, the pressure value in the cavity will increase as the internal space becomes smaller (the negative pressure value decreases). After the internal space is almost completely infilled, the air extraction is no longer needed. Therefore, the controller compares the sixth negative pressure value with the sixth preset pressure value, and the sixth preset pressure value may be the pressure value in the cavity where the internal space is almost completely infilled.

Step S351: the air extraction module is controlled to stop the air extraction when the sixth negative pressure value matches the sixth preset pressure value.

Step S361: whether the loading duration matches the preset loading duration is determined.

The controller compares the loading duration with the preset loading duration.

Step S371: when the loading duration matches the preset loading duration, the controller controls the loading module to stop the liquid loading.

In the embodiment, the controller uses the pressure value to determine when to stop the air extraction, and uses the loading duration to determine when to stop the liquid loading. The air extraction can be stopped after the air extraction module has extracted out all the air in the cavity. The embodiment can realize automatic control of the air extraction module and the loading module.

In another embodiment of the liquid loading method, the pressure value can be used to determine when the air extraction module stops the air extraction, and the loading amount can be used to determine when to stop the liquid loading. That is, step S361 can also be controlling the loading module to stop the liquid loading by determining whether the loading amount matches the preset loading amount.

In another embodiment of the liquid loading method, the memory stores the preset extracting duration, and the preset extracting duration includes the first preset extracting duration and the second preset extracting duration. The controller uses the first extracting duration as the judging standard of the duration for the loading module to start the liquid loading. The second extracting duration is used as the judging standard of the duration for the air extraction after the liquid loading starts. The extracting duration includes the first extracting duration and the second extracting duration. For example, the controller first controls the air extraction module to extract air from the cavity, and records the first air extracting duration. When the first air extraction time reaches the first preset extracting duration, the controller controls the loading module to start the liquid loading. When the second extracting duration is passed again and the second extracting duration reaches the second preset extracting duration, the controller controls the air extraction module to stop the air extraction. When to stop the liquid loading can be determined according to the loading duration, the pressure value, or the loading amount.

Figure 21:
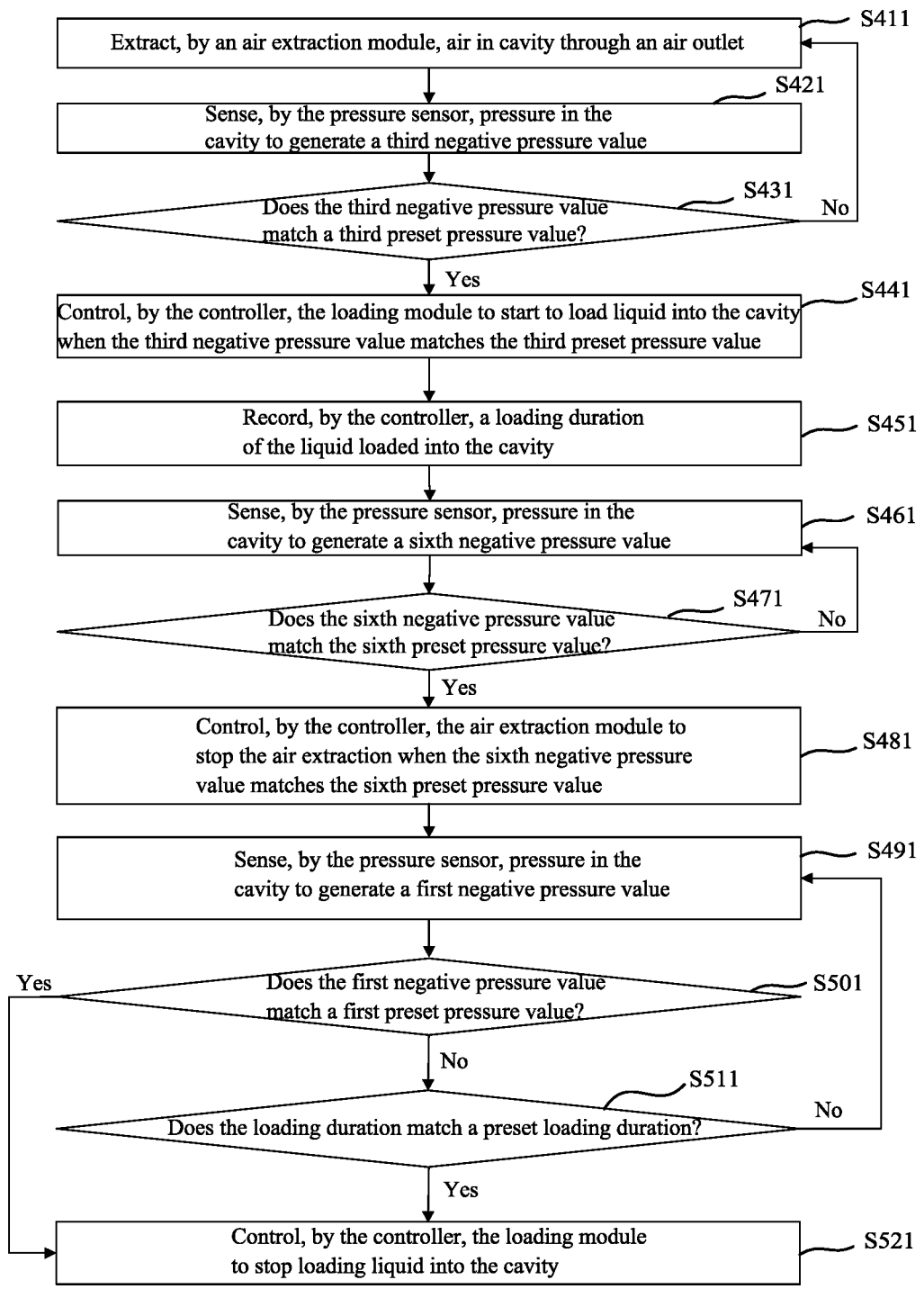
FIG. 21 is a flowchart of a liquid loading method according to yet another embodiment of the present disclosure.

FIG. 21 is a flowchart of a liquid loading method according to an embodiment. In some embodiments, the liquid loading method may include following steps.

Step S411: the air extraction module extract air from the cavity through the air outlet.

The controller controls the air extraction module to start the air extraction through the air outlet. After the air extraction module extracts air, a certain negative pressure environment relative to the outside of the cavity is formed due to the reduction of air in the cavity. In an embodiment, the air extraction module continuously extracts air through the air outlet from the beginning of the air extraction, until the controller controls the air extraction module to stop the air extraction based on certain conditions.

Step S421: the pressure sensor senses the pressure in the cavity to generate a third negative pressure value.

During the air extracting process of the air extraction module, the controller controls the pressure sensor to sense the pressure in the cavity and generates a pressure value, that is, the third negative pressure value.

Step S431: whether the third negative pressure value matches the third preset pressure value is determined.

The memory stores a preset pressure value, that is, the third preset pressure value. The third preset pressure value is stored in the memory in advance as the judging standard of the pressure. At this step, the controller compares stores the third negative pressure value generated at step S421 with the third preset pressure value stored in the memory. When the third negative pressure value does not match the third preset pressure value, step S411 is repeated, at which the controller controls the air extraction module to extract air from the cavity through the air outlet. When the third negative pressure value matches the third preset pressure value, the procedure goes next step S441.

Step S441: when the third negative pressure value matches the third preset pressure value, the controller controls the loading module to start to load liquid into the cavity.

When the third negative pressure value matches the third preset pressure value, the controller controls the loading module to start to load liquid into the cavity through the liquid inlet. In some embodiments, the loading module continuously loads liquid into the cavity from the beginning of the liquid loading, until the controller controls the loading module to stop the liquid loading based on certain conditions.

Step S451: the controller records the loading duration of loading liquid into the cavity by the loading module.

When the loading module starts to load liquid into the cavity, the controller starts to record the loading duration of loading liquid into the cavity. In some embodiments, the time when the loading module starts to load liquid into the cavity is t1. The timing is started at time t1. As the loading module continuously loads liquid into the cavity, the controller continuously records the loading duration of loading liquid into the cavity, and the loading duration at time t2 is t2−t1. In the embodiment, the controller starts to record the loading duration of loading liquid into the cavity based on the third negative pressure value, and may also record the loading duration according to the loading amount from the flow sensor.

Step S461: the pressure sensor senses the pressure in the cavity to generate a sixth negative pressure value.

When the loading module continuously loads liquid into the cavity, the controller controls the pressure sensor to sense the pressure in the cavity and generates another pressure value, that is, the sixth negative pressure value.

Step S471: whether the sixth negative pressure value matches the sixth preset pressure value is determined.

Another preset pressure value, that is, the sixth preset pressure value, is stored in the memory. The sixth preset pressure value is pre-stored in the memory as the judging standard of another pressure. At this step, the controller compares the sixth negative pressure value generated at step S461 with the sixth preset pressure value stored in the memory. When the sixth negative pressure value does not match the sixth preset pressure value, step S461 is repeated. When the sixth negative pressure value matches the sixth preset pressure value, the procedure goes to next step S481.

Step S481: when the sixth negative pressure value matches the sixth preset pressure value, the controller controls the air extraction module to stop the air extraction.

When the controller determines that the sixth negative pressure value matches the sixth preset pressure value, the controller controls the air extraction module to stop the air extraction.

Step S491: the pressure sensor senses the pressure in the cavity to generate a first negative pressure value.

In some embodiments, after the air extraction module stops the air extraction, the pressure in the cavity increases (the negative pressure value decreases) due to the continuous loading of the liquid into the cavity by the loading module. When the pressure increases to a certain level, the filling condition of the liquid in the cavity can be analyzed, which can be used to judge whether the loading amount of the liquid into the cavity matches requirements. Therefore, the controller controls the pressure sensor to sense the pressure in the cavity at a certain moment, and generates another pressure value, that is, the first negative pressure value.

Step S501: whether the first negative pressure value matches the first preset pressure value.

Another pressure value, that is, the first preset pressure value, is stored in the memory, and the first preset pressure value is pre-stored in the memory as the judging standard of another pressure. At this step, the controller compares the first negative pressure value generated at step S491 with the first preset pressure value stored in the memory. When the first negative pressure value does not match the first preset pressure value, the procedure goes to step S511. When the first negative pressure value matches the first preset pressure value, the procedure goes to step S521.

Step S511: whether the loading duration matches the preset loading duration is determined.

In some embodiments, when the air extraction module stops the air extraction, as the loading module continuously loads liquid into the cavity, the pressure in the cavity continuously increases. The pressure, which can be used to determine the filling condition of the liquid in the cavity, may have deviations due to the leak happens to the cavity. The leak causes the pressure in the cavity not to continuously increase while the module continuously loads liquid into the cavity after the air extraction module stops the air extraction. The possible result is that the pressure in the cavity does not change or only increases to a certain pressure after the air extraction module stops the air extraction. The certain pressure does not match requirements. In some embodiments, the first preset pressure value is the pressure value that matches the requirements, that is, the first negative pressure value does not match the first preset pressure value. It is possible that the duration of the loading module loading liquid into the cavity does not match the requirements, or the liquid loading into the cavity by the loading module matches the requirements, but leak happens to the cavity. Therefore, to prevent the possible leak in the cavity, the loading duration of loading liquid into the cavity is also used to assist in the judging process. Thus, the liquid is prevented from being continuously loaded into the cavity due to the presence of the leak when the condition of the loaded liquid into the cavity has already met the requirements. In some embodiments, the preset loading duration is stored in the memory. The preset loading duration is used as the judging standard of the loading duration. In some embodiments, the controller continuously records the loading duration of the loading module loading liquid into the cavity. When the first negative pressure value does not match the first preset pressure value, the controller determines whether the loading duration matches the preset loading duration. When the loading duration does not match the preset loading duration, step S491 is repeated, which continuously senses the pressure sensing in the cavity. When the loading duration matches the preset loading duration, the loading amount of the liquid may meet the requirements, then the procedure goes to step S521.

Step S521: the controller controls the loading module to stop loading liquid into the cavity.

When the first negative pressure value in the cavity matches the first preset pressure value, the filling condition of the liquid in the cavity matches the requirements. When the loading duration matches the preset loading duration, the filling condition of the liquid in the cavity may also match the requirements. The controller then controls the loading module to stop loading liquid into the cavity.

In the embodiment, since the pressure change in the cavity is sensed to determine the operations of the air extraction module and the loading module, the filling condition of the liquid in the cavity can be better understood, and better filling effect and filling efficiency can be obtained. Since the loading duration is added to solve the problem that the pressure value cannot be used to judge the state of the end of the liquid loading (for example, leak exists in the cavity), the filling effect is improved.

Figure 22:
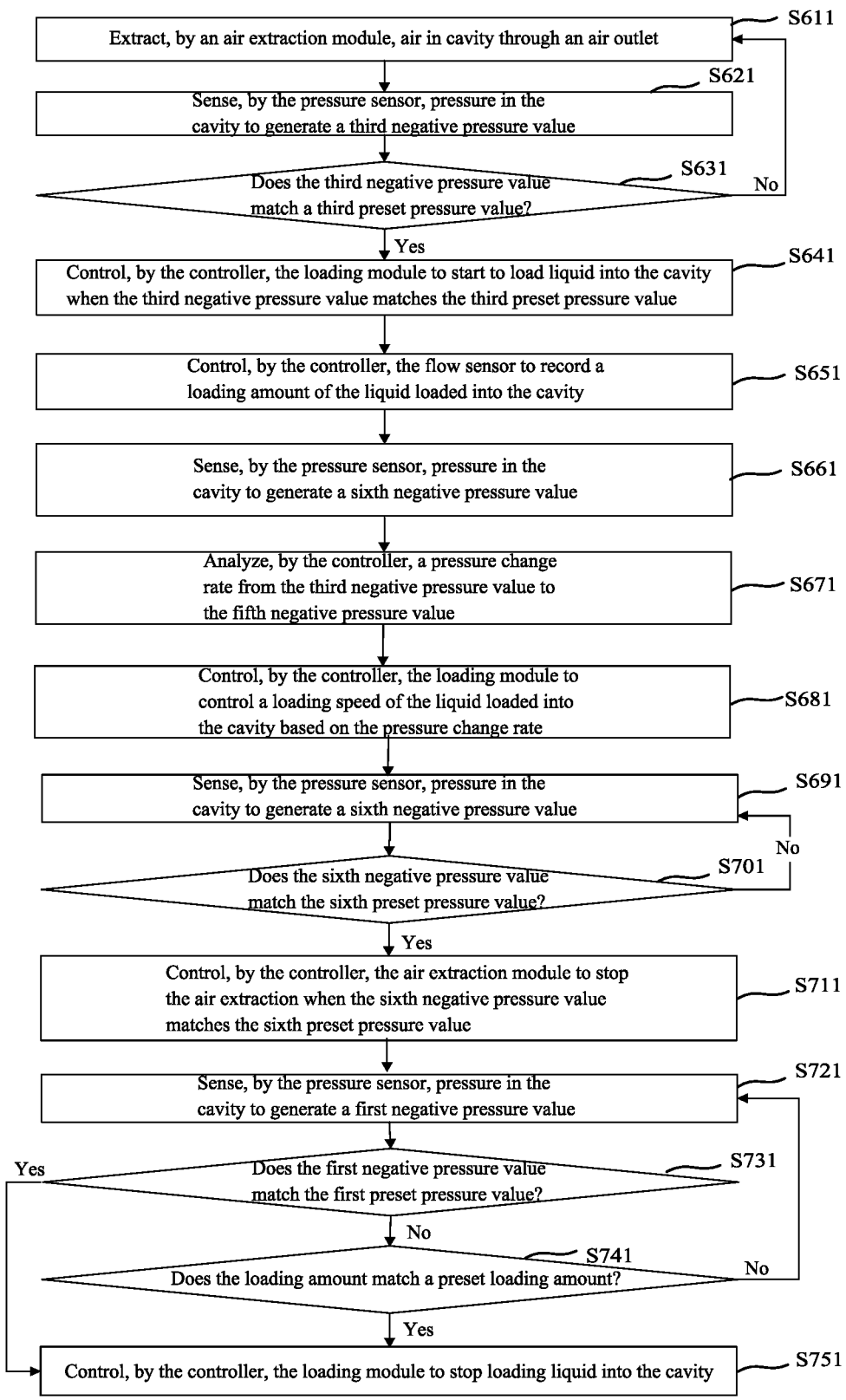
FIG. 22 is a flowchart of a liquid loading method according to yet another embodiment of the present disclosure.

FIG. 22 a flowchart of a liquid loading method according to an embodiment. In some embodiments, the liquid loading method may include following steps.

Step S611: the air extraction module extract air from the cavity through the air outlet.

The controller controls the air extraction module to start the air extraction through the air outlet. After the air extraction module extracts air, a certain negative pressure environment relative to the outside of the cavity is formed due to the reduction of air in the cavity. In an embodiment, the air extraction module continuously extracts air through the air outlet from the beginning of the air extraction, until the controller controls the air extraction module to stop the air extraction based on certain conditions.

Step S621: the pressure sensor senses the pressure in the cavity to generate a third negative pressure value.

During the air extracting process of the air extraction module, the controller controls the pressure sensor to sense the pressure in the cavity and generates a pressure value, that is, the third negative pressure value.

Step S631: whether the third negative pressure value matches the third preset pressure value is determined.

The memory stores a preset pressure value, that is, the third preset pressure value. The third preset pressure value is stored in the memory in advance as the judging standard of the pressure. At this step, the controller compares stores the third negative pressure value generated at step S621 with the third preset pressure value stored in the memory. When the third negative pressure value does not match the third preset pressure value, step S611 is repeated, at which the controller controls the air extraction module to extract air from the cavity through the air outlet. When the third negative pressure value matches the third preset pressure value, the procedure goes next step S641.

Step S641: when the third negative pressure value matches the third preset pressure value, the controller controls the loading module to start to load liquid into the cavity.

When the third negative pressure value matches the third preset pressure value, the controller controls the loading module to start to load liquid into the cavity through the liquid inlet. In some embodiments, the loading module continuously loads liquid into the cavity from the beginning of the liquid loading, until the controller controls the loading module to stop the liquid loading based on certain conditions.

Step S651: the controller controls the flow sensor to record the loading amount of the liquid loaded into the cavity.

After the loading module starts to load liquid into the cavity, the controller controls the flow sensor to record the loading amount of the liquid loaded into the cavity.

Step S661: the pressure sensor senses the pressure in the cavity to generate a sixth negative pressure value.

When the loading module continuously loads liquid into the cavity, the controller controls the pressure sensor to sense the pressure in the cavity and generates another pressure value, that is, the fifth negative pressure value.

Step S671: the controller analyzes the pressure change rate from the third negative pressure value to the fifth negative pressure value.

During the liquid loading process, the pressure in the cavity may change, for example, the negative pressure value may continue to drop. After the first loading duration Δt, the pressure sensor senses the pressure in the cavity, that is, the fifth negative pressure value (less than the third negative pressure value). According to the third negative pressure value, the fifth negative pressure value, and the first loading duration Δ t, the pressure change rate in the cavity can be obtained. The formula may be (the fifth negative pressure value–the third negative pressure value)/Δt.

Step S681: the controller controls the loading module to control the loading speed of the liquid loaded into the cavity based on the pressure change rate.

When the pressure change rate, which is equal to (the fifth negative pressure value–the third negative pressure value)/Δt, is higher than the preset threshold, the loading speed may be too fast, which hinders the extraction of the air from the cavity or in the liquid. At this time, the controller can control the loading module to slow down the loading speed. In some embodiments, the controller may record multiple pressure values from the pressure sensor according to actual needs, and then calculate the loading speed accordingly.

Step S691: the pressure sensor senses the pressure in the cavity to generate a sixth negative pressure value.

When the loading module continuously loads liquid into the cavity, the controller controls the pressure sensor to sense the pressure in the cavity and generates another pressure value, that is, the sixth negative pressure value.

Step S701: whether the sixth negative pressure value matches the sixth preset pressure value is determined.

Another pressure value, that is, the sixth preset pressure value, is stored in the memory. The sixth preset pressure value is used as the judging standard of another pressure. At this step, the controller compares the sixth negative pressure value generated at step S461 with the sixth preset pressure value stored in the memory. When the sixth negative pressure value does not match the sixth preset pressure value, step S691 is repeated. When the sixth negative pressure value matches the sixth preset pressure value, the procedure goes to next step S711.

Step S711: when the sixth negative pressure value matches the sixth preset pressure value, the controller controls the air extraction module to stop the air extraction.

When the controller determines that the sixth negative pressure value matches the sixth preset pressure value, the controller controls the air extraction module to stop the air extraction, to maintain the air in the cavity.

Step S721, the pressure sensor senses the pressure in the cavity to generate a first negative pressure value.

In some embodiments, after the air extraction module stops the air extraction, the pressure in the cavity increases due to the continuous loading of the liquid into the cavity by the loading module. When the pressure increases to a certain extent, the filling condition of the liquid in the cavity can be understood, which can be used to determine whether the state of the loaded liquid in the cavity matches the requirements. Therefore, at a certain moment, the controller controls the pressure sensor to sense the pressure in the cavity and generate another pressure value, namely, the first negative pressure value.

Step S731: whether the first negative pressure value matches the first preset pressure value is determined.

Another pressure value is stored in the memory, that is, the first preset pressure value. The first preset pressure value is used as the judging standard of another pressure. At this step, the controller compares the first negative pressure value generated at step S491 with the first preset pressure value stored in the memory. When the first negative pressure value does not match the first preset pressure value, the procedure goes to step S741. When the first negative pressure value matches the first preset pressure value, the procedure goes to step S751.

Step S741, whether the loading amount matches the preset loading amount is determined.

In some embodiments, after the air extraction module stops the air extraction, the air is kept in the cavity. As the loading module continuously loads liquid into the cavity, the pressure in the cavity continuously increases. The pressure, which can be used to determine the filling condition of the liquid in the cavity, may have deviations due to the leak happens to the cavity. The leak causes the pressure in the cavity not to continuously increase while the module continuously loads liquid into the cavity after the air extraction module stops the air extraction. The possible result is that the pressure in the cavity does not change or only increases to a certain pressure after the air extraction module stops the air extraction. The certain pressure does not match requirements. In some embodiments, the first preset pressure value is the pressure value that matches the requirements, that is, the first negative pressure value does not match the first preset pressure value. It is possible that the duration of the loading module loading liquid into the cavity does not match the requirements, or the liquid loading into the cavity by the loading module matches the requirements, but leak happens to the cavity. Therefore, to prevent the possible leak in the cavity, the loading duration of loading liquid into the cavity is also used to assist in the judging process. Thus, the liquid is prevented from being continuously loaded into the cavity due to the presence of the leak when the condition of the loaded liquid into the cavity has already met the requirements. In some embodiments, the preset loading duration is stored in the memory. The preset loading duration is used as the judging standard of the loading duration. In some embodiments, the controller continuously records the loading duration of the loading module loading liquid into the cavity. When the loading duration does not match the preset loading duration, step S721 is repeated, which continuously senses the pressure sensing in the cavity. When the loading duration matches the preset loading duration, the loading amount of the liquid may meet the requirements, then the procedure goes to step S751.

Step S751, the controller controls the loading module to stop loading liquid into the cavity.

When the first negative pressure value in the cavity matches the first preset pressure value, the filling condition in the cavity matches the requirements. When the loading duration matches the preset loading duration, the filling condition of the liquid in the cavity may also match the requirements. The controller then controls the loading module to stop loading liquid into the cavity.

In the embodiment, steps S661 to S681 can be omitted.

In the embodiment, since the pressure change in the cavity is sensed to determine the operations of the air extraction module and the loading module, the filling condition of the liquid in the cavity can be better understood, and better filling effect and filling efficiency can be obtained. Since the loading duration is added to solve the problem that the pressure value cannot be used to judge the state of the end of the liquid loading (for example, leak exists in the cavity), the liquid filling performance is improved. In addition, the pressure change rate in the cavity is used by the loading module to control the loading speed of the liquid loaded into the cavity, which allows the liquid to be evenly distributed in the cavity and improving the filling effect.

In addition, the loading method arranges an elastic member at the liquid inlet, which can prevent external air from entering the cavity of the product, and also prevent the liquid in the cavity from overflowing from the liquid inlet.

Furthermore, the liquid loading method arranges the breathable member at the air outlet, which can cooperate with air extraction module. Thus, when the air extraction module extracts air, the liquid in the cavity can be prevented from overflowing from the air outlet and further blocking the air outlet.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A liquid loading device for loading liquid into a product, the product comprising a liquid inlet, an air outlet, and a cavity, the liquid inlet and the air outlet communicating with the cavity, the liquid loading device comprises:
   a loading module configured to load liquid into the cavity through the liquid inlet;
   a pressure sensor configured to sense a pressure in the cavity and generate at least one pressure value;
   an air extraction module configured to extract air in the cavity through the air outlet; and
   a controller coupled to the loading module and the air extraction module, the controller configured to control the air extraction module to operate based on related data, and the related data comprising at least one of a duration, the at least one pressure value, and a loading amount of liquid loaded into the cavity,
   wherein the at least one pressure value comprises a first negative pressure value, the controller is further configured to control the loading module to stop loading the liquid into the cavity when the first negative pressure value matches a first preset pressure value;
   wherein the control module is further configured to control the air extraction module to start extracting air before or when the liquid is started loading into the cavity, and to stop extracting air before the liquid is stopped loading into the cavity.

2. The liquid loading device of claim 1, wherein the duration comprises at least one of an extracting duration of extracting air or a loading duration of loading liquid into the cavity, the controller is configured to control the air extraction module to stop extracting air when the extracting duration reaches a preset extracting duration.

3. The liquid loading device of claim 1, wherein the at least one pressure value further comprises a sixth negative pressure value, the controller is configured to control the air extraction module to stop extracting air when the pressure value reaches the sixth negative pressure value.

4. The liquid loading device of claim 1, wherein the duration further comprises a loading duration for loading the liquid into the cavity, and the controller is further configured to control the loading module to stop loading the liquid based on the loading duration, the loading amount, or the at least one pressure value.

5. The liquid loading device of claim 1, further comprising a flow sensor configured to sense the loading amount, wherein the duration comprises a loading duration of loading the liquid into the cavity, the controller is configured to control the air extraction module to stop extracting air based on the loading amount or the loading duration.

6. The liquid loading device of claim 1, wherein the controller is further configured to control the loading module to load the liquid into the cavity through the liquid inlet, and control the air extraction module to simultaneously extract air from the cavity through the air outlet during a portion of a loading duration.

7. A liquid loading method for loading liquid into a product by a liquid loading device, the liquid loading device comprising a loading module, an air extraction module, and a controller coupled to the loading module and the air extraction module, the product comprising a cavity, a liquid inlet and an air outlet communicating with the cavity, the liquid loading method comprising:
   extracting, by the air extraction module, air from the cavity through the air outlet;
   loading, by the loading module, liquid into the cavity through the liquid inlet;
   sensing, by a pressure sensor, a pressure in the cavity to get at least one pressure value, wherein the at least one pressure value comprises a first negative pressure value;
   controlling, by the controller, the loading module to stop loading the liquid into the cavity when the first negative pressure value matches a first preset pressure value;
   controlling, by the controller, the air extraction module to operate based on related data, the related data comprising at least one of a duration, the at least one pressure value, and a loading amount of liquid loaded into the cavity, wherein the air extraction module starts extracting air before or when the liquid is started loading into the cavity, and stops extracting air before the liquid is stopped loading into the cavity.

8. The liquid loading method of claim 7, wherein the duration comprises a loading duration for loading the liquid into the cavity, and the liquid loading method further comprises:
   controlling, by the controller, the loading module to operate based on the related data, and the related data comprise at least one of the loading duration, the at least one pressure, and the loading amount.

9. The liquid loading method of claim 7, wherein the duration comprises an extracting duration, and controlling, by the controller, the air extraction module to operate based on related data comprises:
controlling, by the controller, the air extraction module to stop extracting air when the extracting duration reaches a preset extracting duration.

10. The liquid loading method of claim 9, further comprising sensing the pressure in the cavity to get at least one pressure value, the at least one pressure value comprises a seventh negative pressure value, and the liquid loading method further comprises:
controlling, by the controller, the loading module to start to load or stop loading the liquid when the pressure value reaches the seventh negative pressure value.

11. The liquid loading method of claim 7, wherein the at least one pressure value further comprises a sixth negative pressure value, and controlling, by the controller, the air extraction module to operate based on related data comprises:
controlling, by the controller, the air extraction module to stop extracting air when the pressure value reaches the sixth negative pressure value.

12. The liquid loading method of claim 11, wherein the at least one pressure value further comprises a third negative pressure value, and the liquid loading method further comprises:
controlling, by the controller, the loading module to start to load the liquid when the pressure value reaches the third negative pressure value.

13. The liquid loading method of claim 12, wherein the at least one pressure value further comprises a fifth negative pressure value, the fifth negative pressure value is less than the third negative pressure value, and the liquid loading method further comprises:
analyzing, by the controller, a change rate from the third negative pressure value to the fifth negative pressure value; and
controlling, by the controller, the loading module to control a loading speed of the liquid into the cavity based on the change rate.

14. The liquid loading method of claim 7, wherein the duration further comprises a loading duration of loading liquid to the cavity, and the liquid loading method further comprises:
controlling, by the controller, the loading module to stop loading the liquid based on the loading duration or the loading amount.

* * * * *